(12) United States Patent
Huh et al.

(10) Patent No.: US 7,642,017 B2
(45) Date of Patent: Jan. 5, 2010

(54) REFLECTIVE PHOTOMASK, METHOD OF FABRICATING THE SAME, AND REFLECTIVE BLANK PHOTOMASK

(75) Inventors: Sung-min Huh, Yongin-si (KR); Hee-bom Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 468 days.

(21) Appl. No.: 11/723,472

(22) Filed: Mar. 20, 2007

(65) Prior Publication Data

US 2007/0224523 A1 Sep. 27, 2007

(30) Foreign Application Priority Data

Mar. 21, 2006 (KR) .................... 10-2006-0025811

(51) Int. Cl.
*G03F 1/00* (2006.01)
(52) U.S. Cl. .......................................... 430/5
(58) Field of Classification Search ............... 430/5; 378/35
See application file for complete search history.

(56) References Cited

U.S. PATENT DOCUMENTS 6,998,200 B2 * 2/2006 Lee ............................ 430/5

2005/0064298 A1 3/2005 Silverman
2005/0106474 A1 * 5/2005 Kindt et al. .................. 430/5

FOREIGN PATENT DOCUMENTS

| JP | 2002-261005 | 9/2002 |
|---|---|---|
| JP | 2003-257824 | 9/2003 |
| JP | 2005-037798 | 2/2005 |
| KR | 1020030006968 A | 1/2003 |
| KR | 1020030071194 A | 9/2003 |

OTHER PUBLICATIONS

Korean Notice of Examination Report dated Dec. 11, 2006.
Office Action for corresponding Korean application dated May 17, 2007.

* cited by examiner

*Primary Examiner*—Stephen Rosasco
(74) *Attorney, Agent, or Firm*—Harness, Dickey & Pierce

(57) ABSTRACT

The reflective photomask may include a substrate, a reflective layer formed on the substrate, an absorption pattern formed on the reflective layer and over a first portion of the substrate. A compensatory portion may be formed over at least a second portion of the substrate. The second portion is adjacent to the first portion, and the compensatory portion is thinner than the absorption pattern.

49 Claims, 14 Drawing Sheets

REFLECTIVE PHOTOMASK, METHOD OF FABRICATING THE SAME, AND REFLECTIVE BLANK PHOTOMASK

PRIORITY STATEMENT

This application claims priority under 35 USC § 119 to Korean Patent Application No. 2006-0025811, filed on Mar. 21, 2006, in the Korean Intellectual Property Office (KIPO), the entire contents of which are herein incorporated by reference.

BACKGROUND

1. Field

Example embodiments relate to a reflective photomask, a method of fabricating the same, and a reflective blank photomask.

2. Description of the Related Art

The development of highly integrated semiconductor devices may depend on uniformly and finely forming patterns having line widths of less than a sub-micrometer. This fine pattern forming may depend on the patterning ability of the photolithography process. The patterning ability of the photolithography process may be improved by various parameters (e.g., the wavelength of light, photolithography equipment, and the experience of the operator in performing the photolithography process).

A pattern resolution representing the ability of finely forming patterns may be expressed as the following equation: $R=k(\lambda/N_A)$, where R=resolution, k=process factor, $\lambda$=wavelength of light, and $N_A$=lens numerical aperture of photolithography equipment.

The lower the resolution (R value) is, the better the fine pattern forming ability may be.

Referring to the above equation, the pattern resolution may be proportional to the process factor and the wavelength of light, and inversely proportional to the lens numerical aperture of the photolithography equipment. The process factor may be the extent or ability of improving the photolithography process by an operator performing the process, a process recipe, and/or etc. The wavelength of light, $\lambda$, may be used as an exposure source. For example, i-line light, having a wavelength of about 365 nm, KrF light having a wavelength of about 248 nm, and ArF light having a wavelength of about 193 nm have been used. $N_A$ may be the lens numerical aperture of the equipment for performing the photolithography process. As the aperture of the lens is increased to collect as much light having pattern information as possible, the resolution may be improved.

The process factor, k, and the lens numerical aperture, $N_A$, have almost reached the limitation of a current wavelength band of light, and only slight improvements may be had. As such, research has been conducted in an effort to decrease the wavelength of light.

Recently, the photolithography technique using EUV (Extremely Ultra Violet) light has been studied and may be known to be commercially feasible. The EUV light may be referred to as a soft X-ray, and may be a microwave having a wavelength of only about 13.4 nm. Accordingly, it had been expected that EUV light may improve the fine pattern forming ability. However, because EUV light may be absorbed by most media, including air, the established transmission photomask may not be well suited for the photolithography process in fabricating a semiconductor device. However, a photolithography technique using a reflective photomask may be used instead.

Because the reflective photomask may reflect more than 90% of EUV light that may be irradiated, the energy efficiency may be good and the fine pattern forming ability may be excellent. Accordingly, a reflective photomask may be the next generation photomask technique. However, the photolithography process using the reflective photomask may be limited due to structural defects of the reflective photomask.

A reflective photomask will now be more fully described with reference to FIG. 1. FIG. 1 is a cross-sectional view illustrating a reflective photomask according to the related art.

Referring to FIG. 1, the reflective photomask according to the related art may include a reflective layer 20 on a substrate 10 and an absorption pattern 30 on the reflective layer 20. The reflective layer 20 may be formed on the substrate 10 and may reflect incident light. The absorption pattern 30 may keep pattern information to be transferred onto a wafer, and may absorb rather than reflect incident light.

In the reflective photomask, light may not enter vertically and be reflected at the surface of the photomask, but may enter diagonally at an angle (for example, about 1° to 6°) and be reflected. Therefore, the phenomenon (left side) of the incident light not arriving at the reflective layer 20 due to the absorption pattern 30 may occur, and the phenomenon (right side) of the reflected light at the reflective layer 20 not being reflected due to the sidewall of the absorption pattern 30 may occur. Even though an undesired reflection of light may occur at the sidewall of the absorption pattern 30 (not shown), light diffracted at the edge of the absorption pattern 30 may be transmitted onto the wafer.

Because light may be diffracted from the surface and the inside of the reflective layer 20 to transmit the pattern information, the remaining portion of the diffracted light may be essential. However, as illustrated on the right side of FIG. 1, if a portion of the diffracted light is not transmitted onto the wafer, due to the different thickness of the absorption pattern 30, the pattern on the photomask may not coincide with the pattern on the wafer. The pattern information and focus may be moved onto either the photomask or the wafer, and distorted pattern information may be transmitted.

These phenomena cause a shadow effect such that the pattern image information may not properly be transmitted onto the wafer. As a result, the pattern vertical to and the pattern parallel to an irradiating direction of light may have different line widths, and one problem may be that the focus of light irradiated onto the wafer may shake.

The aforementioned defects may be influenced by, for example, the material, slope, height, and pitch between the patterns of the absorption pattern 30 formed on the surface of the reflective photomask. In order to overcome the material problem of the absorption pattern 30, studies have been conducted to develop an absorber of various materials. In order to overcome the slope problem of the absorption pattern 30, much effort has been made to improve the fabrication process of the photomask.

However, the defects caused by the structural characteristics of the reflective photomask may not be remedied by an improvement in the process and in the materials. As long as the absorption pattern 30 has a different thickness, it may be difficult to reduce or prevent the loss of light, which may be diagonally incident at the edge and at the sidewall of the absorption pattern 30.

SUMMARY

Example embodiments provide a reflective photomask including a compensatory portion and a method of fabricating the same. Example embodiments also provide a reflective blank photomask.

According to example embodiments, a reflective photomask may include a substrate, a reflective layer over the substrate, an absorption pattern over the reflective layer and a first portion of the substrate, and a compensatory portion over at least a second portion of the substrate. The second portion is adjacent to the first portion, and the compensatory portion is thinner than the absorption pattern.

The compensatory portion may be formed adjacent to a side of the absorption pattern. The substrate may be formed of quartz and the reflective layer may include a molybdenum layer and a silicon layer. The compensatory portion may be formed of at least one of silicon, silicon oxide, molybdenum, or a multilayer thereof, and a metal or a metal compound including ruthenium or chromium. The absorption pattern may be formed of at least one of a metal and a metal compound including chromium, chromium oxide, tantalum, tantalum nitride, or tantalum boron nitride.

The reflective photomask may further include a capping layer formed between the reflective layer and the compensatory portion. The capping layer may be formed of at least one of silicon, silicon oxide, molybdenum, or a multilayer thereof, and a metal or a metal compound including ruthenium or chromium.

The reflective photomask may also include a buffer pattern formed between the reflective layer and the absorption pattern. The buffer pattern may be formed of at least one of silicon, silicon oxide, molybdenum, or a multilayer thereof, and a metal or a metal compound including ruthenium or chromium.

According to example embodiments, a method of fabricating a reflective photomask may include forming a reflective layer over a substrate, forming an absorption pattern over the reflective layer and a first portion of the substrate, and forming a compensatory portion over at least a second portion of the substrate. The second portion is adjacent to the first portion, and the compensatory portion is formed thinner than the absorption pattern.

The compensatory portion may be formed adjacent to a side of the absorption pattern. The substrate may be formed of quartz and the reflective layer may include a molybdenum layer and a silicon layer. The capping layer may be formed of at least one of silicon, silicon oxide, molybdenum, or a multilayer thereof, and a metal or a metal compound including ruthenium or chromium. The absorption pattern may be formed of at least one of a metal and a metal compound including chromium, chromium oxide, tantalum, tantalum nitride, or tantalum boron nitride.

BRIEF DESCRIPTION OF THE DRAWINGS

Example embodiments will be more clearly understood from the following detailed description taken in conjunction with the accompanying drawings. FIGS. 1-15 represent non-limiting, example embodiments as described herein.

FIG. 1 is a cross-sectional view illustrating a reflective photomask according to the related art.

DETAILED DESCRIPTION OF EXAMPLE EMBODIMENTS

Figure 1:
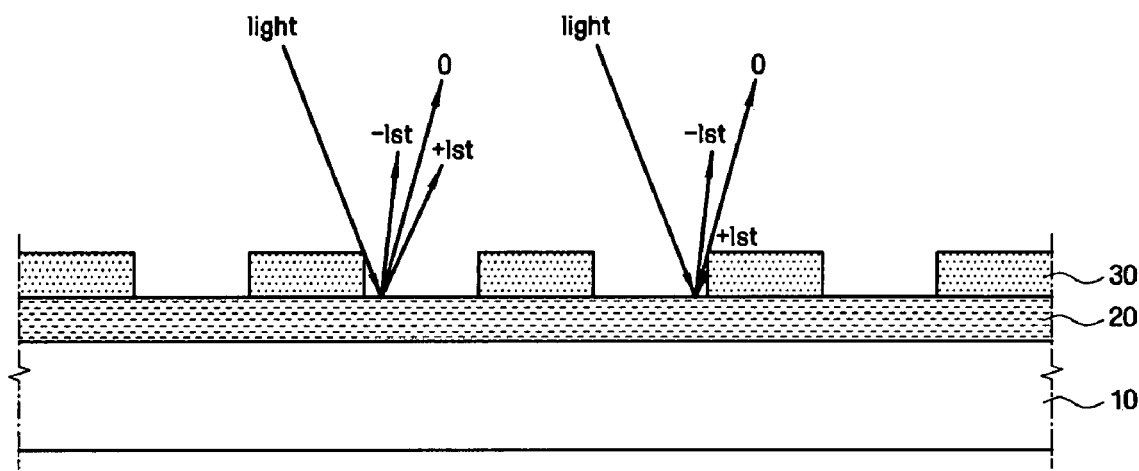

Reference will now be made in detail to example embodiments, examples of which are illustrated in the accompanying drawings. However, example embodiments are not limited to the embodiments illustrated hereinafter, and the embodiments herein are rather introduced to provide easy and complete understanding of the scope and spirit of example embodiments. In the drawings, the thicknesses of layers and regions are exaggerated for clarity.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A reflective photomask of example embodiments refers to a reflective photomask for a photolithography process using, but not limited to, EUV light. The reflective photomask may be referred to, not as a photomask for transferring pattern information onto a wafer by transmitting light, but as a photomask for transferring pattern information onto a wafer by reflecting an incident light. In addition, the photomask may be used together with the term "reticle."

All of the photomasks, including the reflective photomask, of example embodiments may be used in the state in which a patterned surface faces downward. This is because the wafer may be positioned below the photomask for fabrication. However, example embodiments may describe the state in which a patterned surface faces upward to reflect the process of fabricating a photomask. Therefore, it will be understood that a directional expression, for example, "upper," "an upper direction," or "an upper surface" may also encompass an orientation of "lower," "a lower direction," or "a lower surface," respectively.

Figure 2A:
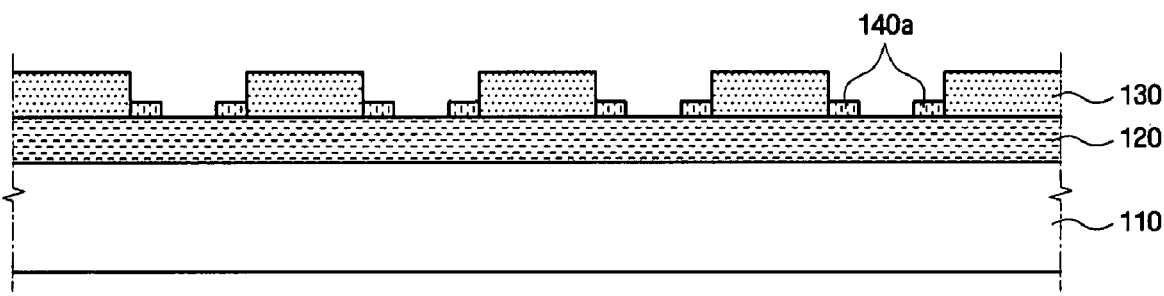
FIGS. 2A and 2B are cross-sectional views illustrating a reflective photomask according to an example embodiment.
Figure 2B:
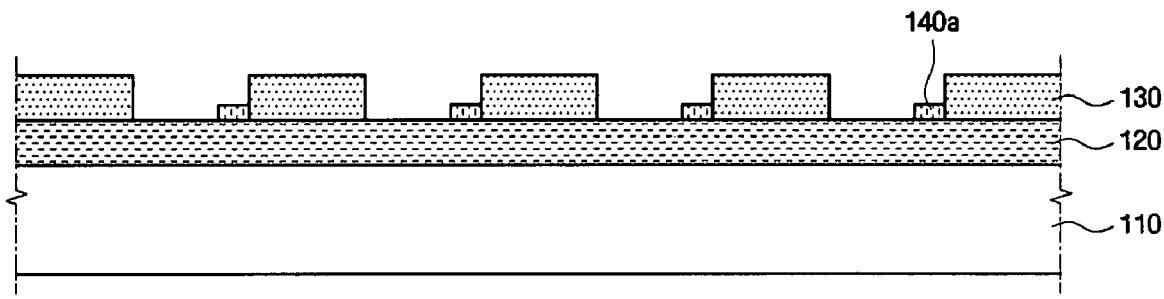

FIGS. 2A and 2B are cross-sectional views illustrating reflective photomasks according to an example embodiment.

Referring to FIG. 2A, a reflective photomask according to example embodiments may include a reflective layer 120 on a substrate 110, an absorption pattern 130 on the reflective layer 120, and a compensatory portion 140a on the reflective layer 120 and formed adjacent to a side of the absorption pattern 130.

The substrate 110 may be a glass substrate formed of quartz.

The reflective layer 120 may include a molybdenum layer and a silicon layer. More specifically, the reflective layer 120 may be formed by stacking the pair of the molybdenum layer and the silicon layer numerous times. Light reflected from the molybdenum layer and light reflected from the silicon layer may interfere with one another. When light reflected from the molybdenum layer and light reflected from the silicon layer have a phase difference of approximately ¼ to ¾, a destructive interference may occur. When a phase difference of not more than approximately ¼ and not less than approximately ¾, a constructive interference may occur. There may be many cases in which the reflective photomask utilizes the destructive interference. In addition, the molybdenum layer may be the main reflective layer and may be a layer for scattering light. The silicon layer may be a sub-reflective layer and may be used as a spacing layer.

A pair of unit reflective layers may include two layers being formed as a multiple of approximately ¼ the wavelength of light. If the thickness of a unit reflective layer is too thin, the complexity of the fabrication process may increase. If a unit reflective layer is too thick, the total thickness of the reflective layer 120 may increase. Therefore, in order to reduce or prevent an occurrence of any of the afore-mentioned problems, a pair of unit reflective layers may be formed to a thickness of approximately ½ the wavelength of light. However, the process may include an error rate of about 10%. Thus, a pair of unit reflective layers may be formed to a thickness of approximately 6.8±0.68 nm. This may be because the light used in example embodiments may be EUV light having a wavelength of approximately 13.4 nm. For light having a different wavelength, the thickness of the reflective layer 120 may change. In addition, the molybdenum layer and the silicon layer may be formed to a thickness of about 2.9 nm and 4.0 nm, respectively.

Though example embodiments illustrate and describe the reflective layer 120 as a single layer, it should be understood that a pair of unit reflective layers may be stacked numerous times.

The absorption pattern 130 may be a pattern for absorbing EUV light. The absorption pattern 130 may include at least any one of a metal and a metal compound including, for example, chromium, chromium oxide, tantalum, tantalum nitride (TaN), or tantalum boron nitride (TaBN).

The thickness of the absorption pattern 130 may be determined such that the absorption pattern 130 may absorb the entering EUV light and other processes, and the thickness may be varied depending upon the material(s) used. Because the absorption pattern 130 may function as a mask for etching the others layers, the absorption pattern 130 may be formed with a thickness sufficient for performing the function of an etching mask. The absorption pattern 130 may be formed to various thicknesses because the formation of the absorption pattern 130 may be influenced by the processing ability.

The absorption pattern 130 may be formed to a thickness of about 70 nm by using tantalum nitride. However, because forming the absorption pattern 130 is not limited to using tantalum nitride, a thickness less than 70 nm and a thickness more than 70 nm may also be obtained. As long as there is no hindrance in transmitting the pattern information onto the wafer, the absorption pattern 130 may be formed as thin as possible. However, the absorption pattern 130 should be formed to a sufficient thickness to ensure the durability of the reflective photomask and the stability of fabricating the photomask. It may be possible to determine the thickness sufficient to satisfy the fabrication capacity of the photomask and to determine the fineness of the pattern information for transmitting onto the wafer through various experiments.

The compensatory portion 140a may reflect entering light, and may be formed to have a smaller thickness than the absorption pattern 130. The thickness and area of the compensatory 140a may be varied depending upon the thickness and area of the absorption pattern 130 and/or the area or distance of the exposed reflective layer 120. The thickness and area of the compensatory portion 140a will be later described in further detail.

The compensatory portion 140a may be formed in two or four directions adjacent to two or four sides of the absorption pattern 130. For example, for a one-dimensional pattern (e.g., a line/space pattern), the compensatory portion 140a may be formed in two directions, and for a two-dimensional pattern (e.g., a contact/via), the compensatory portion 140a may be formed in four directions.

Each compensatory portion 140a may be formed having a different height and a different area. Because incident and reflected light may be directed in one direction, it may not be necessary to form the compensatory portions 140a to be symmetrical to one another. Each compensatory portion 140a interposing the absorption pattern 130 may have a different reflection amount. For example, if light enters from the left at a slope of about 6° with respect to the surface of the photomask and light reflects from the right at a slope of about 6° with respect to the surface of the photomask, the amount of light reflected from the left and the right may differ due to the absorption pattern 130. Accordingly, the compensatory portions 140a may compensate for this difference and may be formed to the left and to the right of the absorption pattern 130 having a different height and a different area.

When the reflective photomask is formed without the compensatory portion 140a, the phase of light reflected from the left and right portions of the absorption pattern 130 each may have a phase difference of about $\pi/4$ and $\pi/6$ in comparison to a normal phase of about $2\pi$. As such, the compensatory portion 140a may be formed such that the left portion of the absorption pattern 130 has a different height and/or a different area than the right portion of the absorption pattern 130. Because the relative phase difference may have a ratio of 3:2, the height and the area of the compensatory portion 140a may be controlled to be inversely proportional. The height and area of the compensatory portion 140a may not be absolute numerical values and may vary depending upon the width, distance, height, and/or material of the absorption pattern 130 formed on the reflective photomask. In addition, the height and area of the compensatory portion 140a may vary depending upon the material(s) used to form the compensatory portion 140a.

The compensatory portion 140a may utilize a material capable of reflecting light and may be formed of, but not limited to, silicon (Si) or silicon oxide ($SiO_2$). The reflective layer 120 may be formed of at least one of a metal or a metal compound (e.g., silicon, silicon oxide, molybdenum, or a multi-layer thereof, ruthenium, chromium, or etc.), and may be formed of other materials.

In the following description, the substrate 110, the reflective layer 120, the absorption pattern 130, and the compensatory portion 140a of FIGS. 2B-15C are similar to those same components referred to in FIG. 2A, and therefore, only the differences are described.

Referring to FIG. 2B, a reflective photomask according to an example embodiment may include a reflective layer 120 on a substrate 110, an absorption pattern 130 on the reflective layer 120, and a compensatory portion 140a formed adjacent to only one or fewer than all of the sides of the absorption pattern 130.

In a photolithography process using EUV light, because light may enter and be reflected in one direction at a predetermined or given angle, the pattern and focus may shift in one direction. As such, it may be difficult to form the compensatory portion 140a in both directions (e.g., the two or four directions adjacent to the absorption pattern 130) even though the compensatory portion 140a may be formed at only one of the sides of the absorption pattern 130. In general, the compensatory portion 140a may be formed at the side of the absorption pattern 130 that is adjacent to the incident light.

In the following description of the reflective photomasks according to example embodiments, the discussion regarding the compensatory portion 140a being formed at one of the sides of the absorption pattern 130 as illustrated in FIG. 2B will be omitted for ease of description. Thus, even though it may not be shown and/or described, the compensatory portion 140a being formed at one of the sides of the absorption pattern 130 may be included in any of the following reflective photomasks. In addition, though it may not be shown and/or described, the compensatory portion 140a being formed at three or four sides of the absorption pattern 130 may also be included.

Figure 3A:
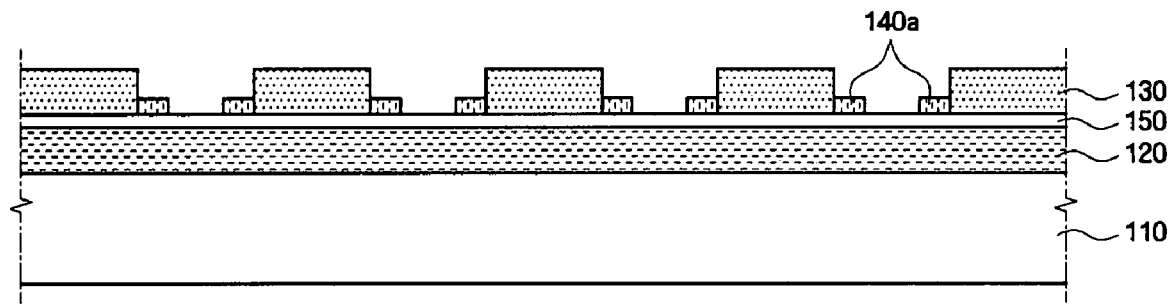
FIGS. 3A and 3B are cross-sectional views illustrating a reflective photomask according to an example embodiment.
Figure 3B:
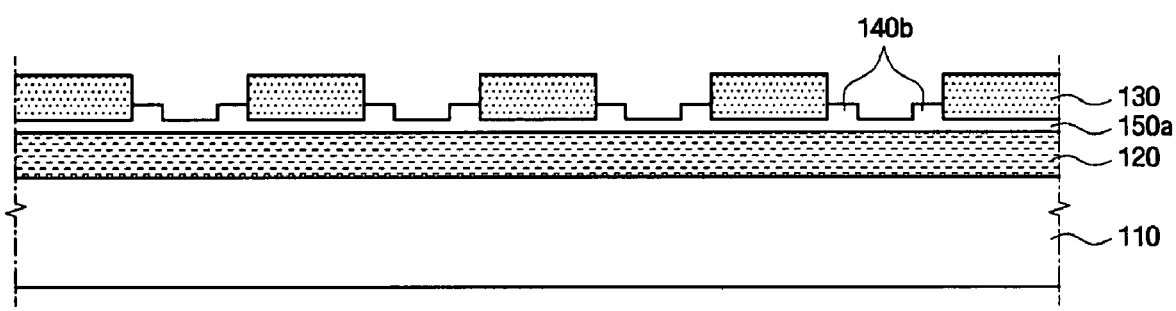

FIGS. 3A and 3B are cross-sectional views illustrating a reflective photomask according to an example embodiment.

Referring to FIG. 3A, a reflective photomask may include a reflective layer 120 on a substrate 110, a capping layer 150 on the reflective layer 120, an absorption pattern 130 on the capping layer 150, and a compensatory portion 140a formed adjacent to a side or sides of the absorption pattern 130.

The capping layer 150 may protect the reflective layer 120 from physical or chemical damage, and may be formed of at least one of a metal or a metal compound (e.g., silicon, silicon oxide, molybdenum, or a multi-layer thereof, ruthenium, chromium, or etc.). Because the reflective layer 120 may be a region that reflects light, the surface of the reflective layer 120 may be an important component. For example, the surface of the reflective layer 120 may be formed to be even and flat without any roughness, and may be formed for protection from physical or chemical damage even after the fabrication has completed. As such, the reflective layer 120 may be protected from physical or chemical damage by forming the capping layer 150 on the reflective layer 120. The capping layer 150 may have good adhesive force, a similar thermal expansion coefficient with respect to the reflective layer 120 and the absorption pattern 130, and resistance against physical or chemical damage. Further, the capping layer 150 may be formed of material that may be used in the fabrication process of a conventional photomask.

The thickness of the capping layer 150 may be determined within an error ratio of about ¼ the wavelength of light when the capping layer 150 is formed of silicon. Because light used in example embodiments has the wavelength of about 13.4 nm, the capping layer 150 may be formed to have a thickness of about 10.05 to 16.75 nm (13.4±3.35=10.05~16.75 nm). However, when the capping layer 150 is formed of a metal, for example, ruthenium, the capping layer 150 may be formed to have a smaller thickness and it may be easier for the capping layer 150 to protect the reflective layer 120 from physical or chemical damage in comparison to a capping layer 150 formed of another material. If the capping layer 150 is formed to a sufficient thickness, the capping layer 150 may be able to absorb and reflect. Accordingly, the capping layer 150 may be formed to have a smaller thickness similar to that of silicon when about several nanometers of silicon are applied.

In example embodiments, the capping layer may also be formed of ruthenium to about 3 nm. Because the experimental results using ruthenium may be similar to the experimental results using silicon, the description of the capping layer using ruthenium will be omitted.

The components of the reflective photomasks according to various example embodiments are similar to those described above. As such, only the additional description with respect to the capping layer 150 will be described.

Referring to FIG. 3B, a reflective photomask according to an example embodiment may include a reflective layer 120 on a substrate 110, a capping layer 150a on the reflective layer 120, an absorption pattern 130 on the capping layer 150a, and a compensatory portion 140b formed adjacent to a side or sides of the absorption pattern 130. The compensatory portion 140b may be a portion of the capping layer adjacent to a side or sides of the absorption pattern 130. The compensatory portion 140b may be formed of the same material as the capping layer 150a. In addition, the capping layer 150a and the compensatory portion 140b may be integrally formed.

As illustrated in FIG. 3B, because the capping layer 150a and the compensatory portion 140b may be formed of the same material, the fabrication process of the reflective photomask may be simplified and there may be an increase in the adhesive force.

Figure 4A:
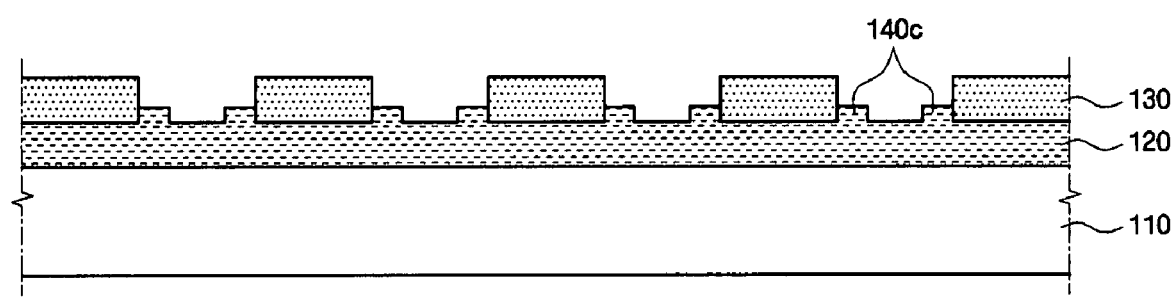
FIGS. 4A and 4B are cross-sectional views illustrating a reflective photomask according to an example embodiment.
Figure 4B:
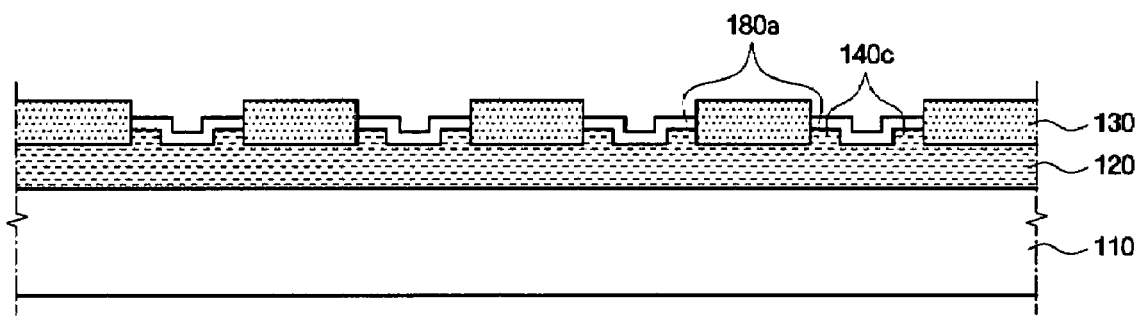

FIGS. 4A and 4B are cross-sectional views illustrating a reflective photomask according to an example embodiment.

Referring to FIG. 4A, a reflective photomask may include a reflective layer 120 on a substrate 110, an absorption pattern 130 on the reflective layer 120, and a compensatory portion 140c formed adjacent to a side or sides of the absorption pattern 130. The compensatory portion 140c may be formed of the same material as the reflective layer 120.

For less physical or chemical damage to the reflective layer 120, it may be better that the compensatory portion 140c be formed of the same material as the reflective layer 120, as opposed to being formed of a different material than the reflective layer 120.

Referring to FIG. 4B, a reflective photomask according to an example embodiment may include a reflective layer 120 on a substrate 110, an absorption pattern 130 on the reflective layer 120, a compensatory portion 140c formed adjacent to a side or sides of the absorption pattern 130, and a protective layer 180a on the surface of the reflective layer 120 and the compensatory portion 140c. The compensatory portion 140c may be formed of the same material as the reflective layer 120.

The protective layer 180a may be formed of at least one of a metal and a metal compound (e.g., silicon, silicon oxide, molybdenum, or a multi-layer thereof, ruthenium, chromium, or etc).

The reflective photomask illustrated in FIG. 4B may be considered if the protective layer 180a is a material that is not easy to pattern, difficult to form into the compensatory portion 140C due to other problems, and/or does not protect the reflective layer 120 from physical or chemical damage.

Figure 5A:
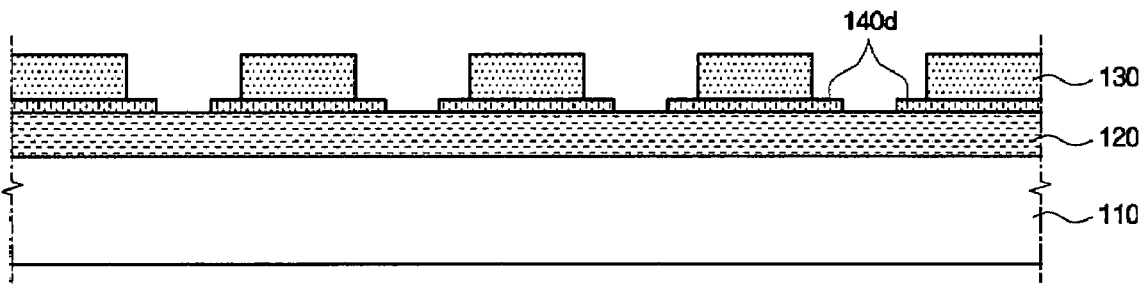
FIGS. 5A to 5C are cross-sectional views illustrating a reflective photomask according to an example embodiment.
Figure 5B:
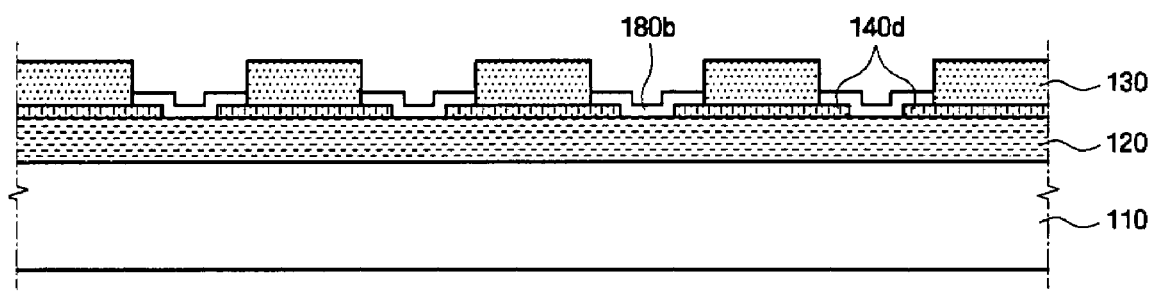
Figure 5C:
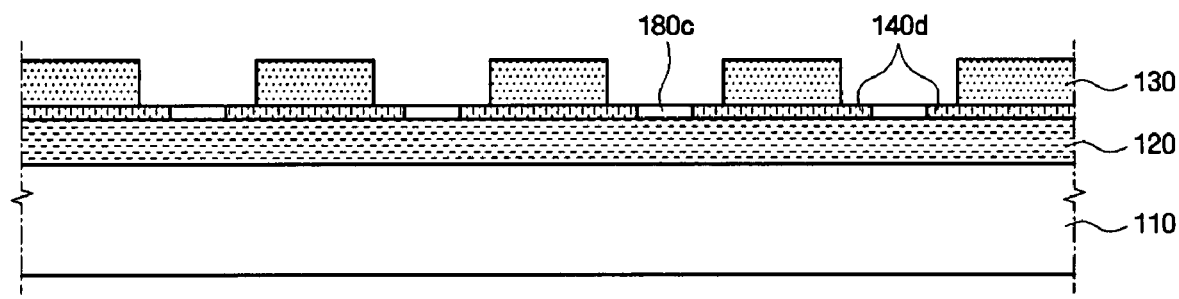

FIGS. 5A to 5C are cross-sectional views illustrating a reflective photomask according to an example embodiment.

Referring to FIG. 5A, the reflective photomask may include a reflective layer 120 on a substrate 110, a compensatory portion 140d on the reflective layer 120, and an absorption pattern 130 on the compensatory portion 140d. As with all the previously described embodiments, at least part of the compensatory portion (here compensatory portion 140d) is formed over a portion of the substrate that is adjacent to the portion of the substrate over which the absorption pattern 130 is formed. It may also be said in this embodiment, the previous embodiments and the following embodiments that the compensatory portion and the absorption pattern 130 lie over adjacent portions of an intermediate layer or layers (e.g., the reflective layer 120, etc.)

The compensatory portion 140d may be formed between the reflective layer 120 and the absorption pattern 130. The reflective photomask may be formed by forming a layer for the compensatory portion 140d and then patterning the layer. The compensatory portion 140d may be formed into a desired shape. In addition, when the compensatory portion 140d is formed of a material having a good adhesive force, the adhesive force between the reflective layer 120 and the absorption pattern 130 may be improved.

Referring to FIG. 5B, the reflective photomask may include a reflective layer 120 on a substrate 110, a compensatory portion 140d on the reflective layer 120, an absorption pattern 130 on the compensatory portion 140d, and a protective layer 180b on the surface of the reflective layer 120 and the compensatory portion 140d. At least part of the compensatory portion (here compensatory portion 140d) is formed over a portion of the substrate that is adjacent to the portion of the substrate over which the absorption pattern 130 is formed.

By forming the protective layer 180b on the reflective layer 120 and the compensatory portion 140d, the reflective layer 120 and the compensatory portion 140d may be protected from physical or chemical damage.

Referring to FIG. 5C, the reflective photomask may include a reflective layer 120 on a substrate 110, a compensatory portion 140d on the reflective layer 120, an absorption pattern 130 on the compensatory portion 140d, and a protective layer 180c on the exposed surface of the reflective layer 120 and the compensatory portion 140d. At least part of the compensatory portion (here compensatory portion 140d) is formed over a portion of the substrate that is adjacent to the portion of the substrate over which the absorption pattern 130 is formed. The protective layer 180c may be formed on the upper portion of the reflective layer 120 and the compensatory portion 140d.

The reflective photomask illustrated in FIG. 5C may be considered for reducing the influence of the protective layer 140d on the optical characteristics of the compensatory portion 140d and for protecting the reflective layer 120 from physical or chemical damage.

Because the reflective photomasks illustrated in FIGS. 5A to 5C may be formed by forming one layer of the compensatory portion 140d on the reflective layer 120 and then patterning the layer, the fabrication process may be simplified.

Figure 6A:
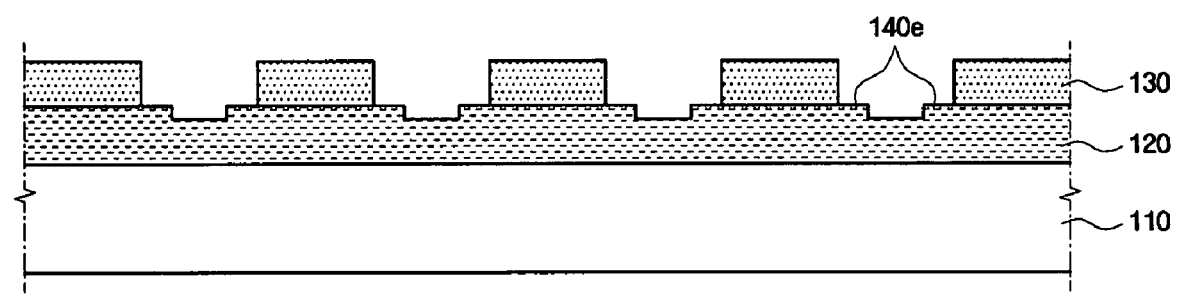
FIGS. 6A and 6B are cross-sectional views illustrating a reflective photomask according to an example embodiment.
Figure 6B:
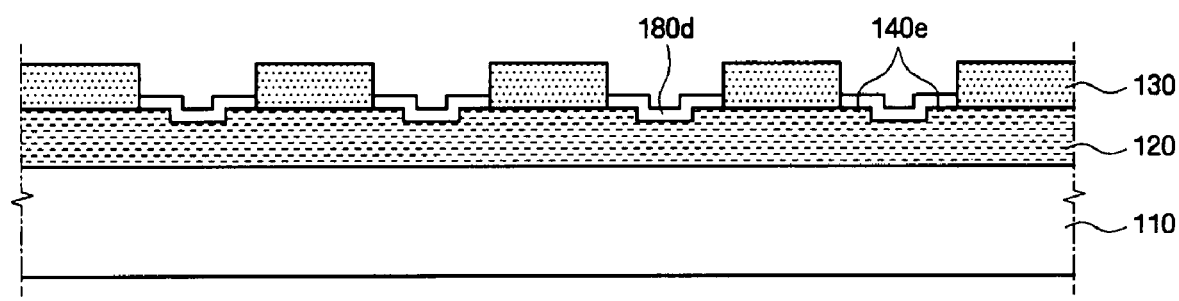

FIGS. 6A and 6B are cross-sectional views illustrating a reflective photomask according to an example embodiment.

Referring to FIG. 6A, the reflective photomask may include a reflective layer 120 on a substrate 110 including a compensatory portion 140e formed on the surface thereof, and an absorption pattern 130 on the reflective layer 120 including the compensatory portion 140e. The compensatory portion 140e may be formed as part of the reflective layer 120. Also, at least part of the compensatory portion (here compensatory portion 140e) is formed over a portion of the substrate that is adjacent to the portion of the substrate over which the absorption pattern 130 is formed.

The reflective photomask illustrated in FIG. 6A may be considered so that there may be sufficient adhesive force between the reflective layer 120 and the absorption pattern 130, and for protecting the reflective layer 120 from physical or chemical damage.

Referring to FIG. 6B, the reflective photomask may include a reflective layer 120 on a substrate 110 including a compensatory portion 140e formed on the surface thereof, an absorption pattern 130 on the reflective layer 120 including the compensatory portion 140e, and a protective layer 180d on the surface of the reflective layer 120 and the compensatory portion 140e. Also, at least part of the compensatory portion (here compensatory portion 140e) is formed over a portion of the substrate that is adjacent to the portion of the substrate over which the absorption pattern 130 is formed. The protective layer 180d may be formed on the reflective layer 120 and the compensatory portion 140e.

Figure 7A:
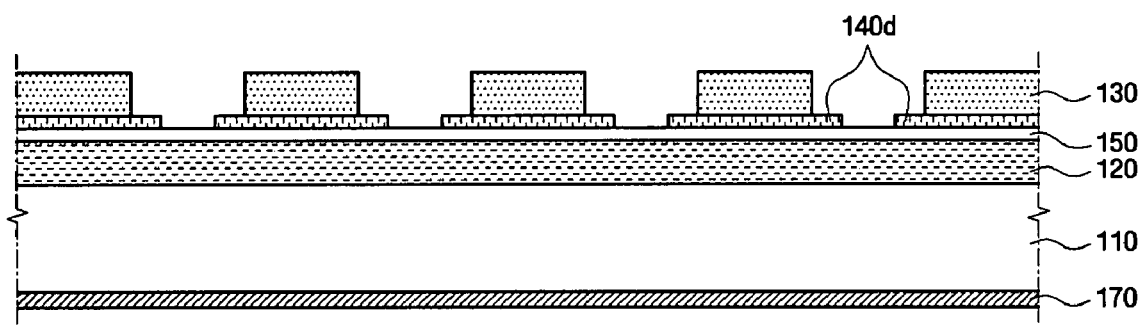
FIGS. 7A and 7B are cross-sectional views illustrating a reflective photomask according to an example embodiment.
Figure 7B:
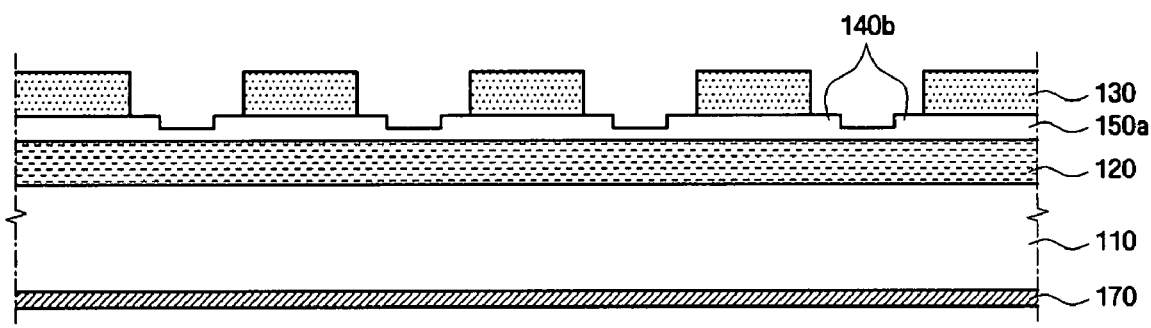

FIGS. 7A and 7B are cross-sectional views illustrating a reflective photomask according to an example embodiment.

Referring to FIG. 7A, the reflective photomask may include a reflective layer 120 on a substrate 110, a capping layer 150 on the reflective layer 120, a compensatory portion 140d on the capping layer 150, an absorption pattern 130 on the compensatory portion 140d, and a metal layer 170 at the lower surface of the substrate 110.

The compensatory portion 140d may be formed as one layer between the capping layer 150 and the absorption pattern 130. Because the compensatory portion 140d may have one layer that may be formed, the fabrication process may be simplified and the adhesive force of the capping layer 150 and the absorption pattern 130 may be improved. At least part of the compensatory portion (here compensatory portion 140d) is formed over a portion of the substrate that is adjacent to the portion of the substrate over which the absorption pattern 130 is formed. In addition, if the selected etching process of the capping layer 150 and the absorption pattern 130 is not sufficient, the reflective photomask having the structure illustrated in FIG. 7A may be fabricated as an alternative.

The metal layer 170 formed at the lower surface of the substrate 110 may be used to affix the reflective photomask to, for example, an electrode static chuck used in the photolithography process. The metal layer 170 may be formed of a material capable of being affixed to the electrode static chuck, and may be formed of at least one of the metals including chromium, a metal alloy, a metal compound, and/or other metallic material.

It may not be necessary to limit the thickness of the metal layer 170 as long as the thickness is sufficient for the metal layer 170 to adhere to the substrate 110 and sufficient against the weight of the reflective photomask. The thickness of the metal layer 170 may be approximately several tens of nanometers, and the average thickness may be about 60 to 70 nm.

Referring to FIG. 7B, the reflective photomask may include a reflective layer 120 on a substrate 110, a capping layer 150a including a compensatory portion 140b on the reflective layer 120, an absorption pattern 130 on the capping layer 150a, and a metal layer 170 formed at the lower surface of the substrate 110. The compensatory portion 140b may be a portion of the capping layer 150a. At least part of the compensatory portion (here compensatory portion 140b) is formed over a portion of the substrate that is adjacent to the portion of the substrate over which the absorption pattern 130 is formed.

The compensatory portion 140b may be formed of the same material as the capping layer 150a. Because the compensatory portion 140b and the capping layer 150a may be formed of the same material, the fabrication process may be simplified, and it may not be necessary to consider the adhesive force between the capping layer 150a and the compensatory portion 140b, which should be considered when the compensatory portion 140b is formed of a different material. Thus, if the compensatory portion 140b is formed of a different material having less desirable physical or chemical characteristics than that of the capping layer 150a, the compensatory portion 140b may be integrally formed with the capping layer 150a.

According to the reflective photomask illustrated in FIGS. 7A and 7B, the metal layer 170 may be formed at the lower surface of the substrate 110. However, the metal layer 170 may be an optional component. Therefore, the metal layer 170 formed at the lower surface of the substrate 110 may be omitted in the reflective photomask illustrated in FIGS. 7A and 7B.

In addition, the metal layer 170 of the reflective photomasks according to all example embodiments may be an optional component, and thus, may be omitted.

Figure 8A:
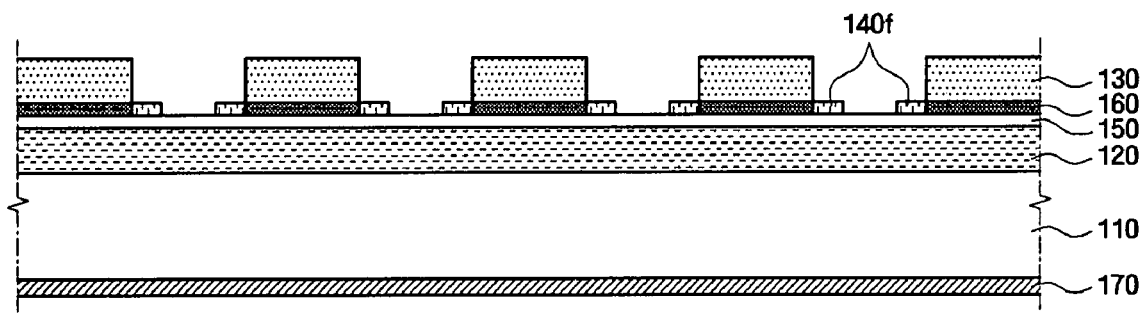
FIGS. 8A and 8C are cross-sectional views illustrating a reflective photomask according to an example embodiment.
Figure 8B:
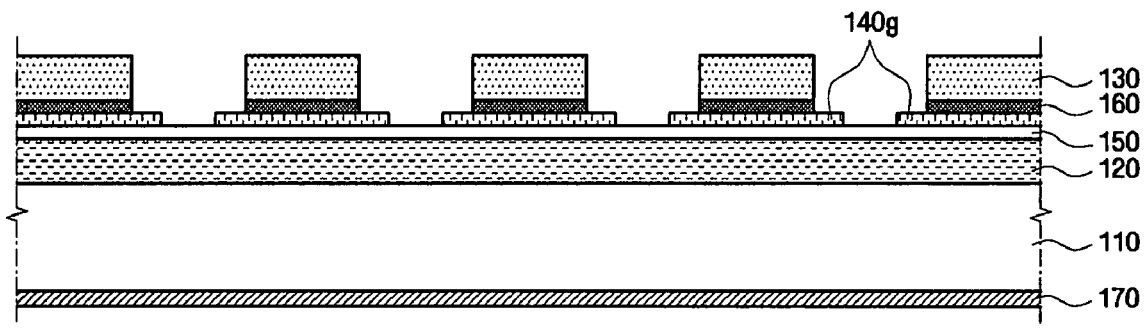
Figure 8C:
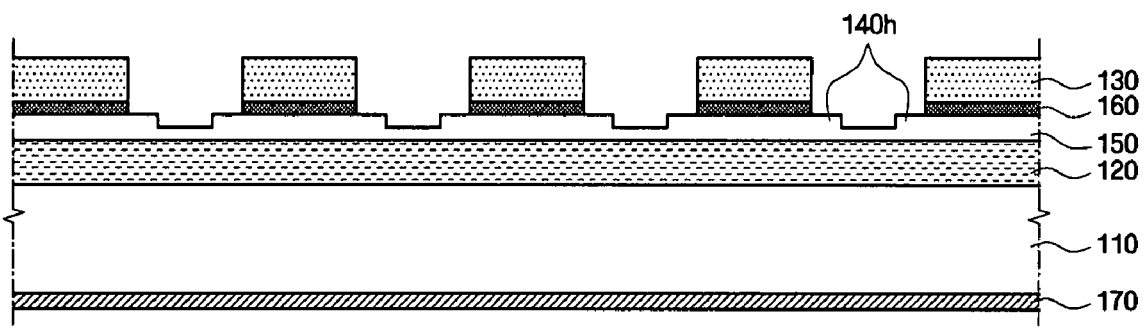

FIGS. 8A to 8C are cross-sectional views illustrating a reflective photomask according to an example embodiment.

Referring to FIG. 8A, the reflective photomask may include a reflective layer 120 on a substrate 110, a capping layer 150 on the reflective layer 120, a buffer pattern 160 on the capping layer 150, an absorption pattern 130 on the buffer pattern 160, a compensatory portion 140f on the capping layer 150, and a metal layer 170 at the lower surface of the substrate 110. At least part of the compensatory portion (here compensatory portion 140f) is formed over a portion of the substrate that is adjacent to the portion of the substrate over which the absorption pattern 130 is formed.

The buffer pattern 160 may be used as an etch stop film during the formation of the absorption pattern 130 and may allow the adhesive force of the capping layer 150 and the absorption pattern 130 to be reinforced. In addition, if the thermal expansion coefficient of the capping layer 150 and the absorption pattern 130 are different, the buffer layer 160 may function as a shock-absorbing layer. The buffer pattern 160 may be formed of various materials, for example, at least one of a metal or a metal compound (e.g., silicon, silicon oxide, molybdenum, or a multi-layer thereof, ruthenium, chromium, or etc.). The buffer pattern 160 may be formed of a material capable of improving the patterning of the absorption pattern 130. The buffer pattern 160 may be formed for reinforcing the adhesive force of the capping layer 150 and the absorption pattern 130 irregardless of the improvement of the patterning of the absorption pattern 130.

For ease of illustration, the thickness of the compensatory portion 140f and the buffer pattern 160 may be the same in the figures. However, the compensatory portion 140f and the buffer pattern 160 may not necessarily be formed to the same thickness.

Referring to FIG. 8B, the reflective photomask may include a reflective layer 120 on a substrate 110, a capping layer 150 on the reflective layer 120, a compensatory portion 140g on the capping layer 150, a buffer pattern 160 on the compensatory portion 140g, an absorption pattern 130 on the buffer pattern 160, and a metal layer 170 at the lower surface of the substrate 110. At least part of the compensatory portion (here compensatory portion 140g) is formed over a portion of the substrate that is adjacent to the portion of the substrate over which the absorption pattern 130 is formed.

The compensatory portion 140g may be formed of one layer and may be formed between the reflective layer 120 and the buffer pattern 160. When the compensatory portion 140g is formed with one layer and patterned, it may allow the adhesive force of the reflective layer 120 and the buffer pattern 160 to be reinforced, and may function as the etch stop film during the formation of the absorption pattern 130 and the buffer pattern 160. The reflective photomask illustrated in FIG. 8B may be considered if the patterning selectivity ratio of the buffer pattern 160 and the capping layer 150 is of greater importance.

Referring to FIG. 8C, the reflective photomask may include a reflective layer 120 on a substrate 110, a capping layer 150 including a compensatory portion 140h on the reflective layer 120, a buffer pattern 160 on the capping layer 150, an absorption pattern 130 on the buffer pattern 160, and a metal layer 170 at the lower surface of the substrate 110. A portion of the compensatory portion 140h may be a part of the capping layer 150.

The capping layer 150 and the compensatory portion 140h may be formed of the same material. A plurality of layers may be stacked and patterned. Accordingly, the capping layer 150 and the compensatory portion 140h may be formed to have the same function. As such, the fabrication process may be simplified.

The metal layer 170 formed at the lower surface of the substrate 110 may be omitted.

Figure 9A:
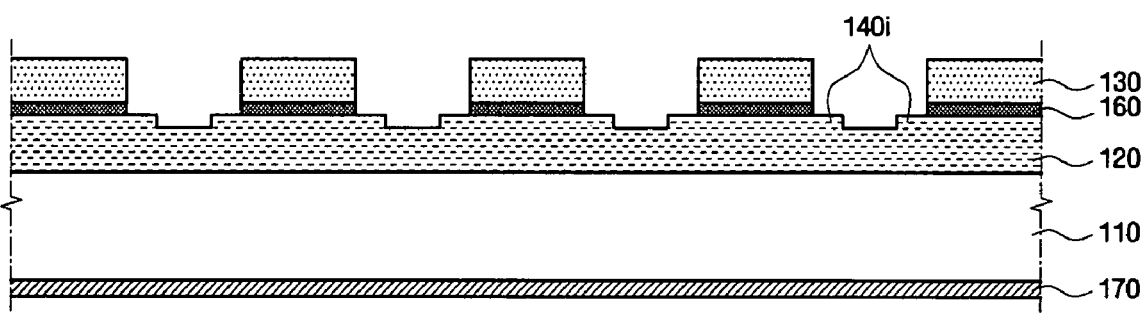
FIGS. 9A and 9B are cross-sectional views illustrating a reflective photomask according to an example embodiment.
Figure 9B:
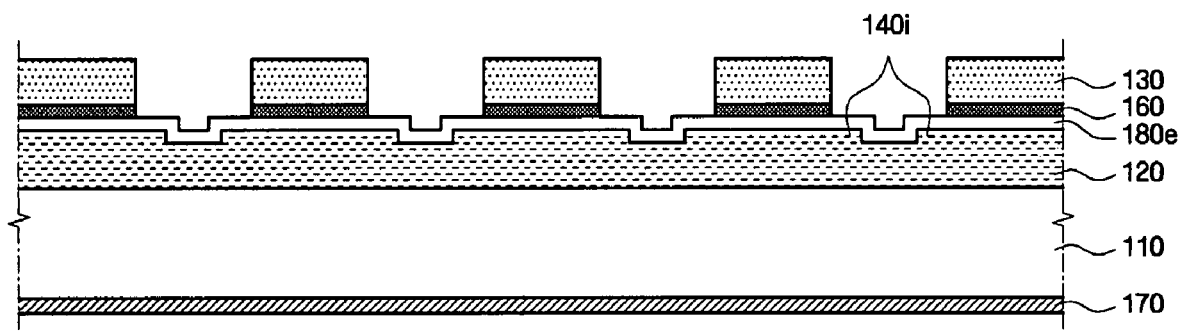

FIGS. 9A and 9B are cross-sectional views illustrating a reflective photomask according to an example embodiment.

Referring to FIG. 9A, a reflective photomask may include a reflective layer 120 including a compensatory portion 140i on a substrate 110, a buffer pattern 160 on the reflective layer 120, an absorption pattern 130 on the buffer pattern 160, and a metal layer 170 at the lower surface of the substrate 110. A portion of the compensatory portion 140i may be a part of the reflective layer 120. At least part of the compensatory portion (here compensatory portion 140i) is formed over a portion of the substrate that is adjacent to the portion of the substrate over which the absorption pattern 130 is formed.

The reflective layer 120 and the compensatory portion 140i may be formed of the same material and may be integrally formed. If the reflective layer 120 and the compensatory portion 140i are formed of the same material, optical characteristics, for example, the reflexibility and the refractive indices, may be the same. Therefore, it may easier to calculate the width and the thickness of the compensatory portion 140i. In addition, because a layer of only one type of material may be patterned, the fabrication process may be simplified.

Referring to FIG. 9B, a reflective photomask may include a reflective layer 120 including a compensatory portion 140i on a substrate 110, a protective layer 180e on the reflective layer 120, a buffer pattern 160 on the protective layer 180e, an absorption pattern 130 on the buffer pattern 160, and a metal layer 170 formed at the lower surface of the substrate 110. A portion of the compensatory portion 140i may be a part of the reflective layer 120. At least part of the compensatory portion (here compensatory portion 140i) is formed over a portion of the substrate that is adjacent to the portion of the substrate over which the absorption pattern 130 is formed.

The protective layer 180e may be formed between the reflective layer 120 including the compensatory portion 140i and the buffer pattern 160. The protective layer 180e may protect the reflective layer 120 including the compensatory portion 140i from physical or chemical damage, and may function as the etch stop film during the formation of the absorption pattern 130 and the buffer pattern 160. The protective layer 180e may reinforce the adhesive force between the reflective layer 120 including the compensatory portion 140i and the buffer pattern 160.

The metal layer 170 formed at the lower surface of the substrate 110 may be omitted.

Figure 10A:
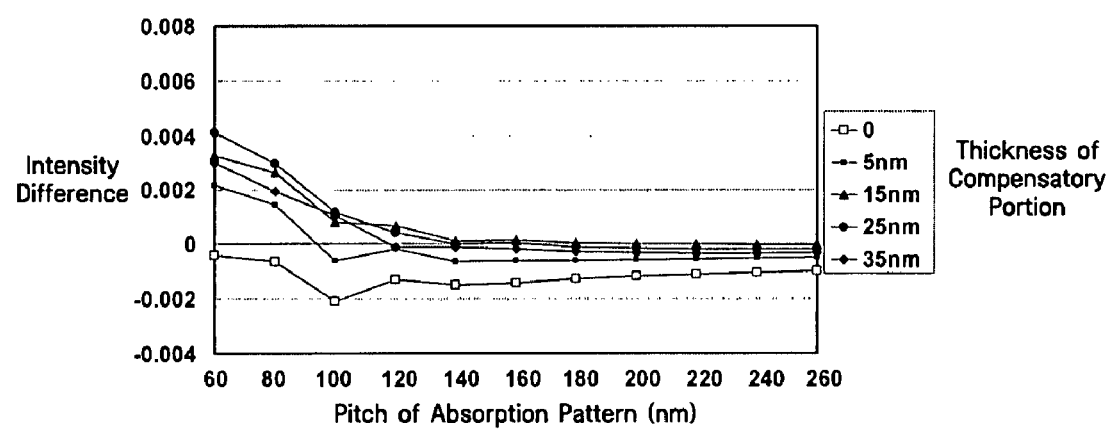
FIGS. 10A to 10C are graphs illustrating intensity data that is measured by performing a photolithography process using one of the reflective photomasks of example embodiments.
Figure 10B:
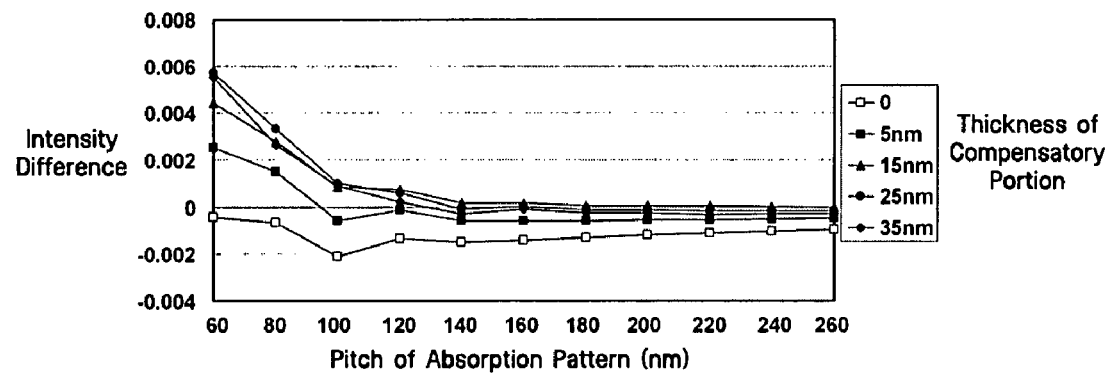
Figure 10C:
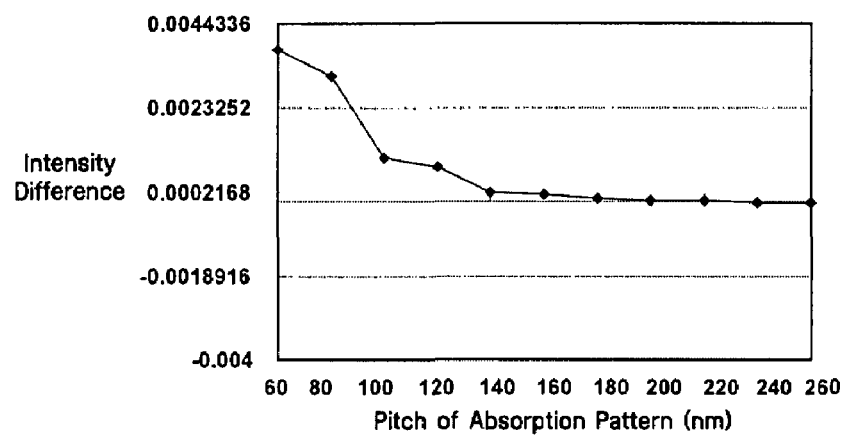

FIGS. 10A to 10C are graphs illustrating intensity data of reflected light measured by performing a photolithography process using a reflective photomask of example embodiments.

FIG. 10A illustrates intensity data of reflected light when silicon nitride $SiO_2$ is used to form the compensatory portion 140f illustrated in FIG. 8A according to an example embodiment.

The X-axis of the graph represents the pitch of various patterns (e.g., a pitch of the absorption pattern 130) and ranges from 60 nm to 260 nm. The Y-axis represents the surface of the reflective photomask (e.g., the intensity difference between the −first-order diffraction light and the +first-order diffraction light of light reflected from the reflective layer 120), and represents the value obtained when the two diffraction lights are added together. Ideally, the value may be zero. The graph illustrates the results of various thicknesses of the compensatory portion 140f ranging from 0 (e.g., the case in which the compensatory portion 140f is not formed) to 35 nm. The line width of the compensatory portion 140f may be about 16 nm, which may not be an optimized line width. However, it may be useful to determine an improved or optimized line width if various experiments are to be performed.

Referring to FIG. 10A, when the pitch of the absorption pattern 130 is between approximately 60 to 80 nm, the compensatory portion 140f not being formed may be better. When the pitch of the absorption pattern 130 is between approximately 80 to 100 nm, the compensatory portion 140f having a thickness of about 5 nm may be better. When the pitch of the absorption pattern 130 is between approximately 100 nm or more, the compensatory portion 140f having a thickness of about 35 nm may be better.

Better results may be obtained when the compensatory portion 140f has a fixed width and a reduced thickness or has a fixed thickness and a reduced width.

FIG. 10B illustrates intensity data of reflected light when silicon (Si) is used to form the compensatory portion 140f illustrated in FIG. 8A according to an example embodiment.

Similar to the graph of FIG. 10A, the X-axis represents the pitch of the absorption pattern 130, and the Y-axis represents the value obtained when the intensity of the −first-order diffraction light and the +first-order diffraction light of light reflected from the reflective layer 120 are added together. The line width of the compensatory portion 140f may be about 16 nm, and the thickness of the compensatory portion 140f may be reduced.

Referring to FIG. 10B, when the pitch of the absorption pattern 130 is between approximately 60 to 80 nm, the compensatory portion 140f not being formed may be better. When the pitch of the absorption pattern 130 is between approximately 80 to 120 nm, the compensatory portion 140f having a thickness of about 5 nm may be better. When the pitch of the absorption pattern 130 is between approximately 120 nm or more, the compensatory portion 140f being formed to have a thickness of about 35 nm may be better.

Referring to FIGS. 10A and 10B, when silicon or silicon oxide is used in forming the compensatory portion 140f, the thickness may be varied according to the pitch of the absorption pattern 130. In addition, the difference of the results when silicon or silicon oxide may not be substantial.

FIG. 10C illustrates the results obtained by forming a multi-layer compensatory portion stacked with another material (e.g., a structure similar to the reflective layer 120). The total thickness of the multi-layer compensatory portion may be about 16 nm by stacking three layers (e.g., silicon/molybdenum/silicon). When the pitch is approximately 140 nm or more, a more stable result may be obtained.

A method of fabricating the reflective photomasks according to example embodiments will now be described. The components illustrated in FIGS. 1A to 15C are similar to those same components previously described. Therefore, only the differences will be described. In addition, the metal layer 170 may be formed at the beginning or at the end of the fabrication process. However, for ease of description, the description of the metal layer 170 is omitted.

FIGS. 11A to 11H are cross-sectional views illustrating a method of fabricating the reflective photomask illustrated in FIG. 8A according to an example embodiment.

Figure 11A:
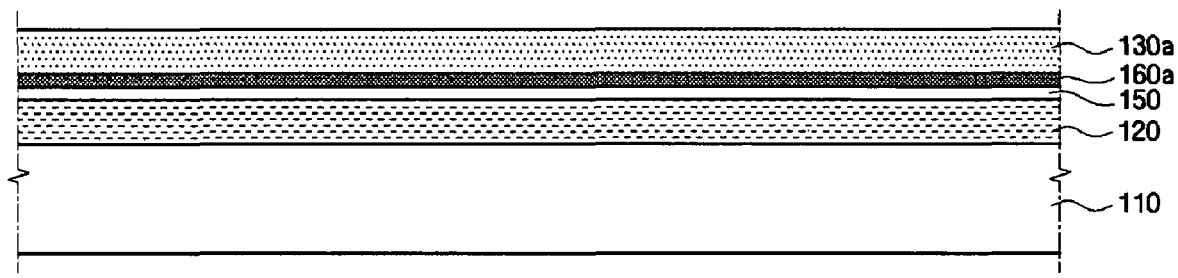
FIGS. 11A to 11H are cross-sectional views illustrating a method of fabricating a reflective photomask according to an example embodiment.

Referring to FIG. 11A, a reflective layer 120 may be formed on a substrate 110, a capping layer 150 may be formed on the reflective layer 120, a buffer layer 160a may be formed on the capping layer 150, and an absorption layer 130a may be formed on the buffer layer 160a.

The reflective layer 120 may be formed by alternately stacking a first reflective layer and a second reflective layer. The reflective layer 120 may be formed by stacking several pairs of the molybdenum layers as the first reflective layer and by stacking silicon layers as the second reflective layer. The total thickness of the first reflective layer and the second reflective layer may be formed to about ½ the wavelength of light to be used. However, there may be an error of about ±¼ because destructive interference may occur when two lights have a phase difference of about ±¼. When molybdenum and silicon are used as the first reflective layer and the second reflective layer, respectively, the relative thickness may be determined according to the refractive index of each. Accordingly, the thickness ratio of the first reflective layer and the second reflective layer may be about 2.9:4. Because the ratio may be determined according to the refractive indices of molybdenum and silicon, the thickness may be changed if the material is altered. Because dozens of pairs of layers may be stacked, the height of a pair may be formed to a length of about 6.9 nm. The total thickness of the reflective layer 120 may correspond to the thickness in which 40 pairs of layers are stacked. The total thickness of the reflective layer 120 may be formed such that incident light may be reflected (e.g., a thickness corresponding to 40 pairs being stacked). The reflective layer may be formed to have a smaller or a larger thickness than the above-mentioned thickness.

A physical or chemical vapor deposition method may be used for forming the reflective layer 120. Based on the material of each unit reflective layer, the better processing method may be selected.

The capping layer 150 may be formed of at least one of silicon, silicon oxide, molybdenum, or a multilayer thereof, and a metal or a metal compound including ruthenium or chromium.

The capping layer 150 may be formed to a thickness of about 11 nm. The capping layer 150 may protect the reflective layer 120 from physical or chemical damage during and after the fabrication of the reflective photomask. Because an excessive thickness may influence the optical characteristics of the reflective photomask, the capping layer 150 may be formed to have the minimum thickness necessary to protect the reflective layer 120. Even though the thickness of the capping layer 150 may be formed to about 11 nm, the capping layer may be formed to a smaller thickness of about several nanometers when a metal thin film is used.

A physical or chemical vapor deposition method or a sputtering method may be used in forming the capping layer 150. For example, the chemical vapor deposition method may be used when silicon is used in forming the capping layer 150. In addition, when the surface of the reflective layer 120 is a silicon layer, an epitaxial growth method may be used. Other methods of forming the capping layer 150 may be well known to those skilled in the art, and thus, will be omitted.

The buffer layer 160a for forming the buffer pattern 160 may be formed of chromium nitride according to example embodiments. The buffer layer 160a may also be formed of at least one of silicon, silicon oxide, molybdenum, or a multi-layer thereof, and a metal or a metal compound including ruthenium or chromium.

The buffer layer 160a may be used as the etch stop film when forming the absorption pattern 130 by patterning the absorption layer 130a, and may be used to improve the adhesive force between the capping layer 150 and the absorption layer 130a. If the thermal expansion coefficient of the capping layer 150 and the absorption pattern 130 are different, the buffer layer 160 may function as a shock-absorbing layer. Because the buffer layer 160a is not an essential component, it may be omitted depending upon the characteristics of the capping layer 150 and the absorption layer 130a. For example, if the capping layer 150 and the absorption layer 130a have good adhesive force, a similar thermal expansion coefficient, and sufficiently obtain the etching selectivity, the buffer layer 160a and the buffer pattern 160 may be omitted.

The thickness of the buffer layer 160a may be determined by considering the etching selectivity, the shock-absorbing function of the thermal expansion, and/or the adhesive force between the capping layer 150 and the absorption layer 130a. When formed of chromium nitride, the thickness of the buffer layer may be about 10 nm. However, the thickness may be varied depending on the material of the buffer layer 160a. The buffer layer 160a may be thicker when formed of silicon oxide.

A physical or a chemical vapor deposition method, or a sputtering method may be used in forming the buffer layer 160a.

The absorption layer 130a for forming the absorption pattern 130 may be formed of at least one of a metal and a metal compound including chromium, chromium oxide, tantalum, tantalum nitride, or tantalum boron nitride. When formed of tantalum nitride, the absorption layer 130a, may be formed to a thickness of about 70 nm. The thickness of the absorption layer 130a may be varied by using various materials.

A physical or a chemical vapor deposition method, or a sputtering method may be used in forming the absorption layer 130a.

Figure 11B:
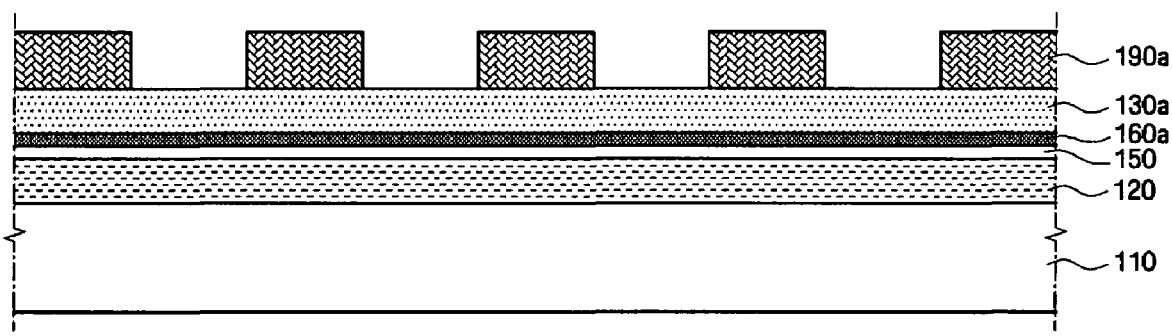

Referring to FIG. 11B, a photoresist pattern 190a may be formed on the absorption layer 130a. The photoresist pattern 190a may be used to pattern the absorption layer and the buffer layer into the absorption pattern 130 and the buffer pattern 160, and may be an electron beam resist. A photoresist layer may be formed on the absorption layer 130a. After irradiating the exposure or the electron beam, the photoresist layer may be selectively removed by using a developing solution, thereby forming the photoresist pattern 190a. Because the technique for forming the photoresist pattern may be well known to those skilled in the art, the description thereof is omitted.

Figure 11C:
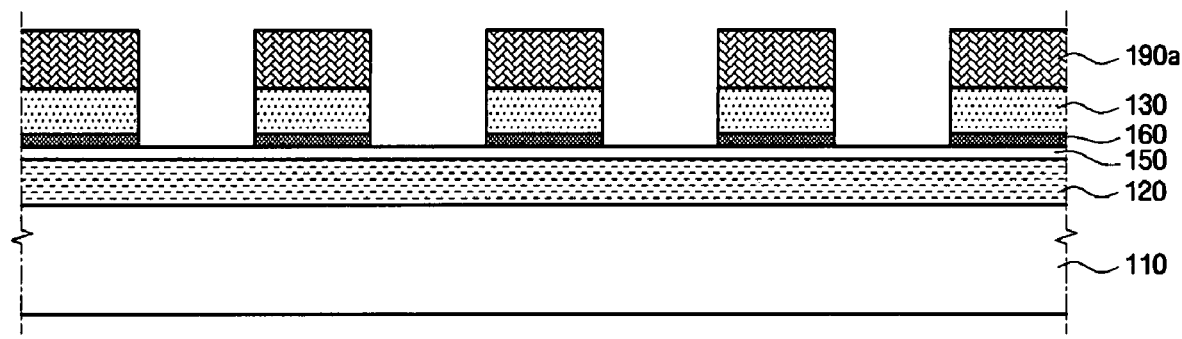

Referring to FIG. 11C, the absorption layer 130a and the buffer layer 160a may be etched by using the photoresist pattern 190a as an etching mask to form the absorption pattern 130 and the buffer pattern 160. The absorption layer 130a and the buffer layer 160a may be etched using the plasma etching method, which etches by mixing a main etching gas and a sub etching gas. The main etching gas may include gases which contain carbon (C), fluorine (F$^-$), chlorine (Cl$^-$), and/or bromine (Br$^-$) radical, for example, $C_xF_y$ gases (e.g., $CF_4$, $CHF_3$, $C_4F_8$, or etc.), $SF_6$, $CCl_2$, and gases containing other C halogen gases (e.g., F, Cl, or Br). The sub etching gas, which may be mixed into the main etching gas, may include an inert gas (e.g., Ne, Ar, Kr, Xe, or etc.), $H_2$, $N_2$, and/or $O_2$.

The patterning of the absorption pattern 130 and the buffer pattern 160 may be performed in at least two steps. The absorption pattern 130 and the buffer pattern 160 may be formed by etching the absorption layer 130a and the buffer layer 160a using the photoresist pattern 190a as the etching mask. In particular, after forming the absorption pattern 130, the buffer pattern 160 may be formed by removing the photoresist pattern 190a and etching the buffer layer 160a using the absorption pattern 130 as the etching mask.

Figure 11D:
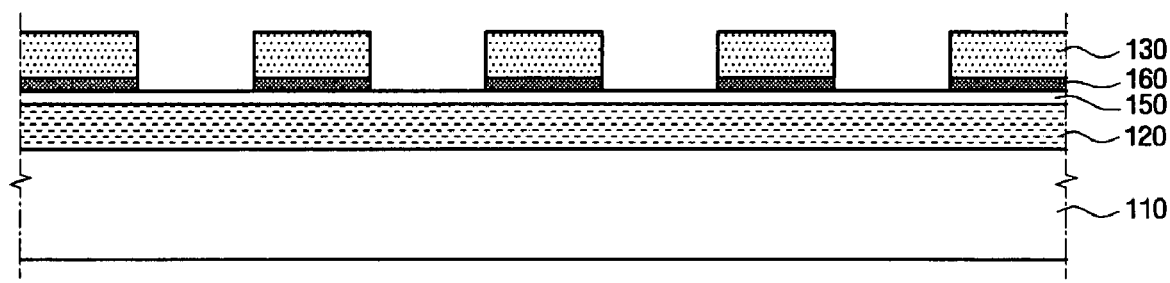

Referring to FIG. 11D, the absorption pattern 130, the buffer pattern 160, and the capping layer 150 may be exposed by removing the photoresist pattern 190a.

The photoresist pattern 190a may be removed using a wet removal method (e.g., an aqueous solution containing sulphuric acid) or may be removed using a dry removal method (e.g., a gas combination containing oxygen $O_2$).

Figure 11E:
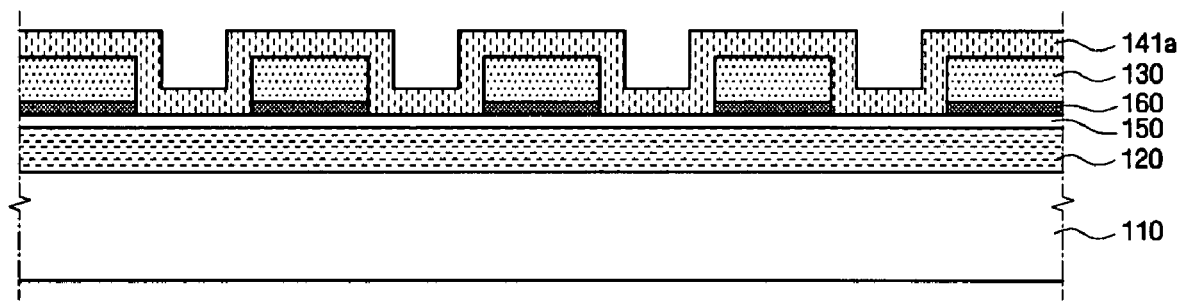

Referring to FIG. 11E, a compensatory layer 141a for forming a compensatory portion may be formed on the surface of the exposed reflective photomask and may be formed of at least one of silicon, silicon oxide, molybdenum, or a multilayer thereof, and a metal or a metal compound including ruthenium or chromium.

The compensatory layer 141a may be formed by using the chemical or physical vapor deposition method, and the compensatory layer 141a formed of molybdenum may be formed by using the sputtering method.

Figure 11F:
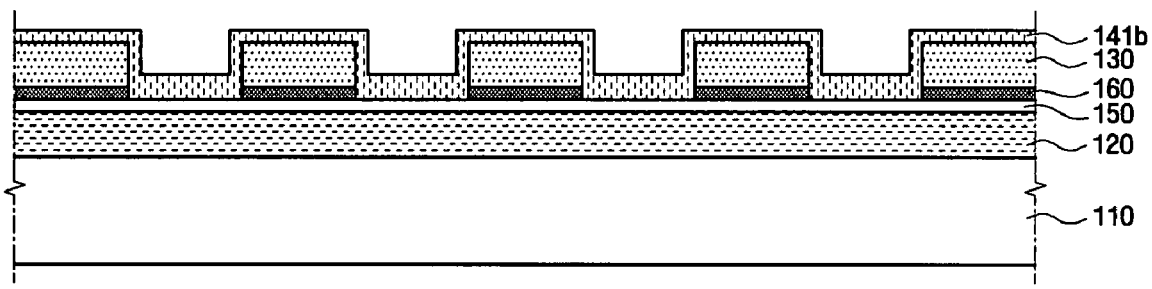

Referring to FIG. 11F, if the capping layer 150 is formed of silicon or silicon oxide, and the compensatory layer 141b is formed of silicon oxide, the compensatory layer 141b formed on the upper portion of the capping layer 150 may be formed to be thicker than the compensatory layer 141b formed at the surface and at the sidewall of the absorption pattern 130 and the buffer pattern 160. As described above, if the compensatory layer 141b of the upper portion of the capping layer 150 is thicker, a more stable compensatory portion may be formed.

Figure 11G:
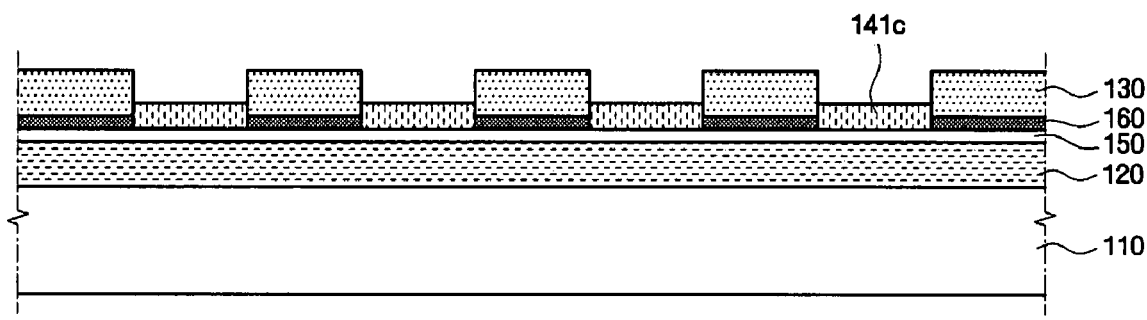

Referring to FIG. 11G, if a capping layer 150 and a compensatory layer 141c are formed of silicon, the capping layer 150 and the compensatory layer 141c may be formed using the epitaxial growth method. The compensatory layer 141c may be formed on the upper portion of the capping layer 150, and not at the surface or at the sidewall of the absorption pattern 130 and the buffer pattern 160. When selectively forming the compensatory layer 141c, an overall etching method may be used. But in order to finely form the compensatory portion, after forming another photoresist pattern, the process for selectively etching the compensatory layer 141c may be used. The method of finely forming the compensatory layer 141c is later described in more detail with reference to FIGS. 12A to 12C.

Figure 11H:
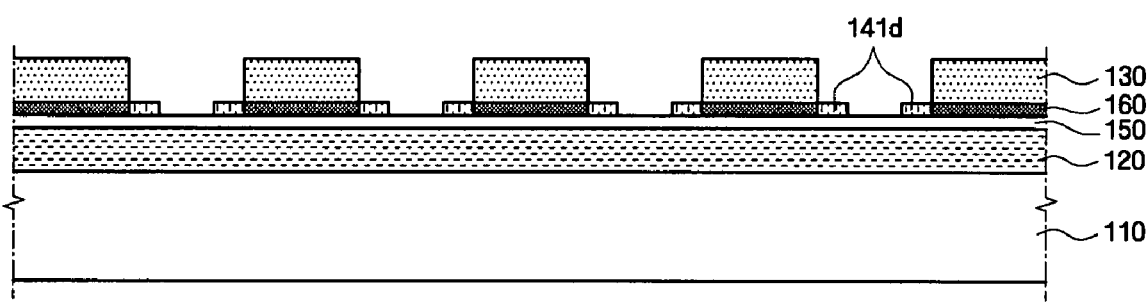

Referring to FIG. 11H, a compensatory portion 141d may be formed by etching the surface of the reflective photomask. If the surfaces of the reflective photomasks illustrated in FIGS. 11E to 11G are etched without an etching mask, the compensatory layers 141a, 141b, and 141c on the surface of the absorption pattern 130 and the capping layer 150 may be etched. Then, the compensatory layers 141a, 141b, and 141c formed at the side of the buffer pattern 160 may be etched. Thus, the compensatory portion 141d illustrated in FIG. 11H may be formed.

Figure 12A:
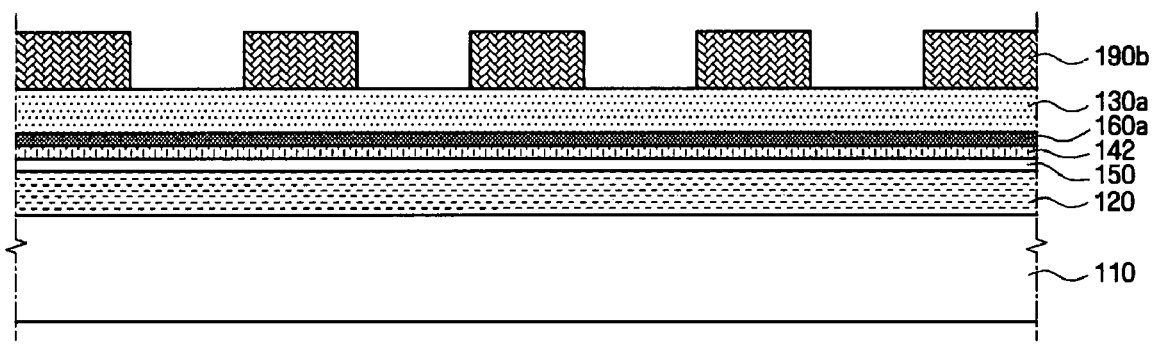
FIGS. 12A to 12C are cross-sectional views illustrating a method of fabricating a reflective photomask according to an example embodiment.
Figure 12B:
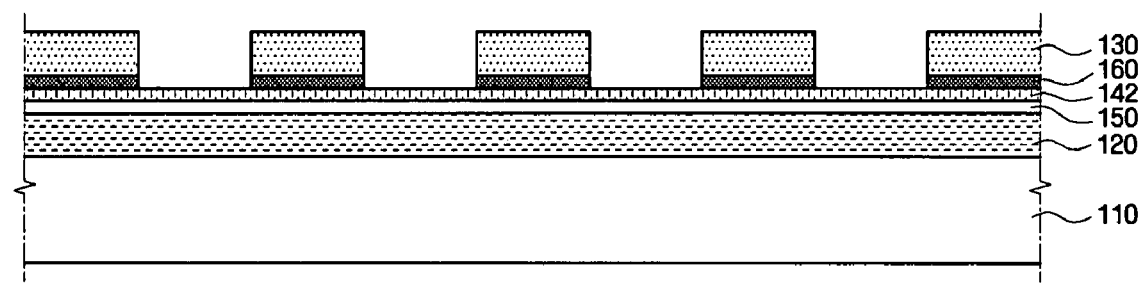
Figure 12C:
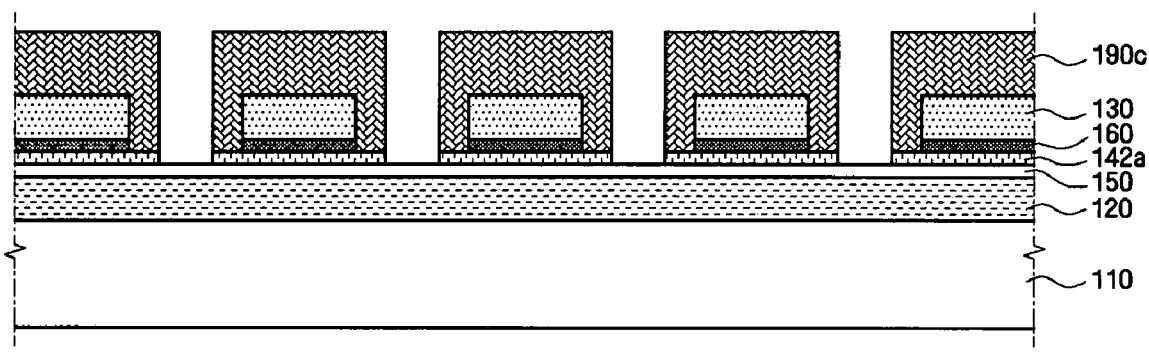

FIGS. 12A to 12C are cross-sectional views illustrating a method of fabricating the reflective photomask illustrated in FIG. 8B according to an example embodiment.

Referring to FIG. 12A, after forming a reflective layer 120 on a substrate 110, forming a capping layer 150 on the reflective layer 120, forming a compensatory layer 142 on the capping layer 150, forming a buffer layer 160a on the compensatory layer 142, forming an absorption layer 130a on the buffer layer 160a, and forming a photoresist layer (not shown) on the absorption layer 130a, a first photoresist pattern 190b may be formed by patterning the photoresist layer. The first photoresist pattern 190b may be used for forming an absorption pattern 130 and a buffer pattern 160.

Referring to FIG. 12B, the absorption pattern 130 and the buffer pattern 160 may be formed by etching the absorption layer 130a and the buffer layer 160a by using the first photoresist pattern 190b as an etching mask. The first photoresist pattern 190b may then be removed.

Referring to FIG. 12C, in order to pattern the exposed compensatory layer 142, a second photoresist pattern 190c for forming a compensatory portion 142a may be formed. The compensatory portion 142a may be formed by etching the compensatory layer 142 using the second photoresist pattern 190c as an etching mask.

The reflective photomask illustrated in FIG. 8B may then be completed by removing the second photoresist pattern 190c.

Figure 13A:
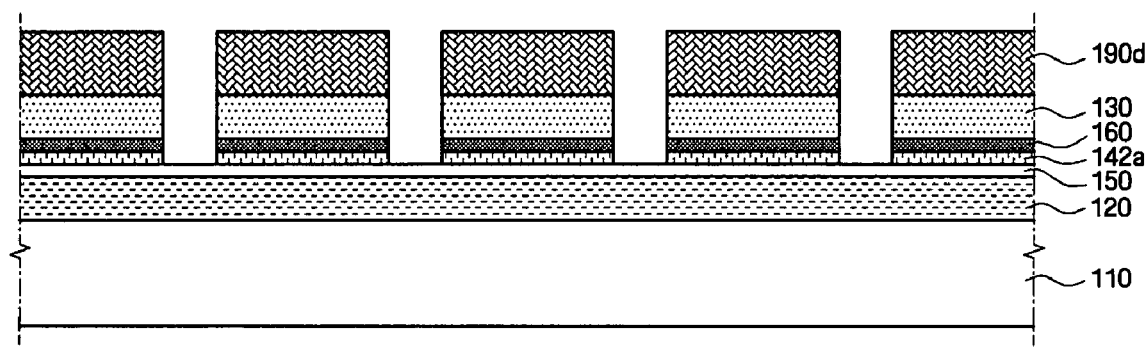
FIGS. 13A and 13B are cross-sectional views illustrating a method of forming a compensatory portion according to an example embodiment.
Figure 13B:
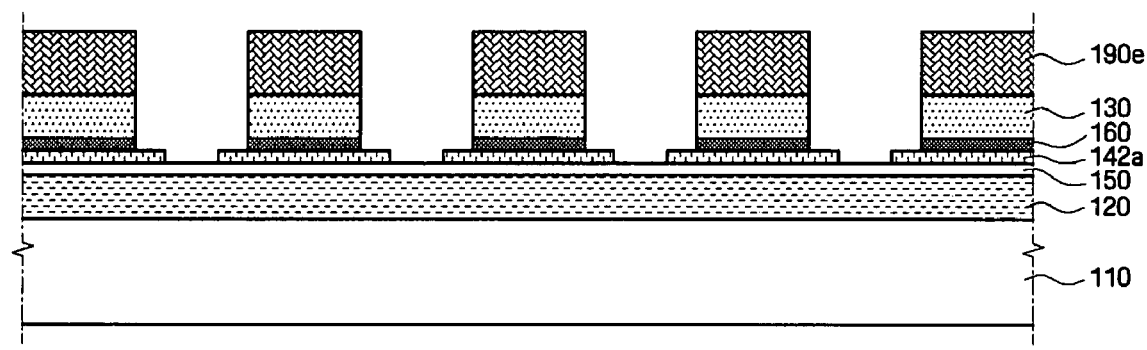

FIGS. 13A and 13B are cross-sectional views illustrating a method of forming the compensatory portion 142a according to an example embodiment.

Referring to FIG. 13A (and in reference to FIG. 12A), after forming a reflective layer 120 on a substrate 110, forming a capping layer 150 on the reflective layer 120, forming a compensatory layer 142 on the capping layer 150, forming a buffer layer 160a on the compensatory layer 142, forming an absorption layer 130a on the buffer layer 160a, and forming a photoresist layer (not shown) on the absorption layer 130a, a first photoresist pattern 190d may be formed by patterning the photoresist layer. The absorption layer 130a, buffer layer 160a, and compensatory layer 142 may be selectively etched by using the first photoresist pattern 190d as an etching mask. The first photoresist pattern 190d may be used for forming the compensatory portion 142a.

Referring to FIG. 13B, after removing the first photoresist pattern 190d, another photoresist layer may be formed and patterned. A second photoresist pattern 190e may then be formed, and an absorption pattern 130 and a buffer pattern 160 may be formed using the second photoresist pattern 190e as an etching mask. If the absorption pattern 130 and the buffer pattern 160 are formed, the compensatory portion 142a may be exposed.

The reflective photomask illustrated in FIG. 8B may be completed by removing the second photoresist pattern 190e.

Figure 14A:
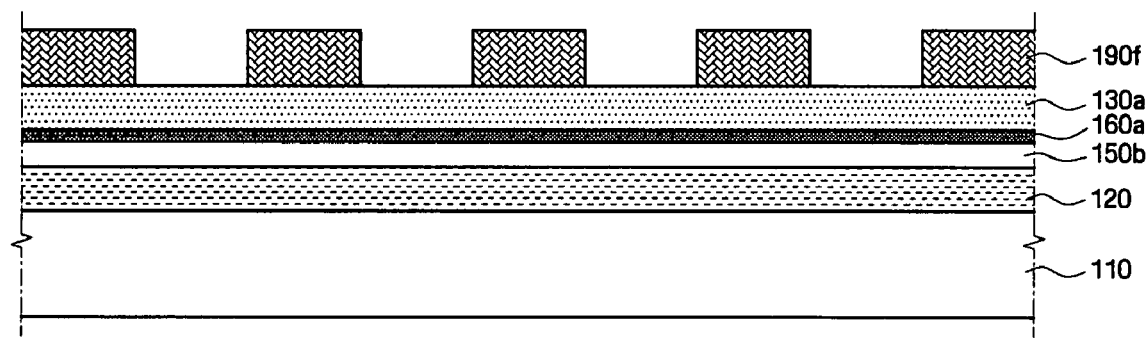
FIGS. 14A to 14C are cross-sectional views illustrating a method of fabricating a reflective photomask according to an example embodiment.
Figure 14B:
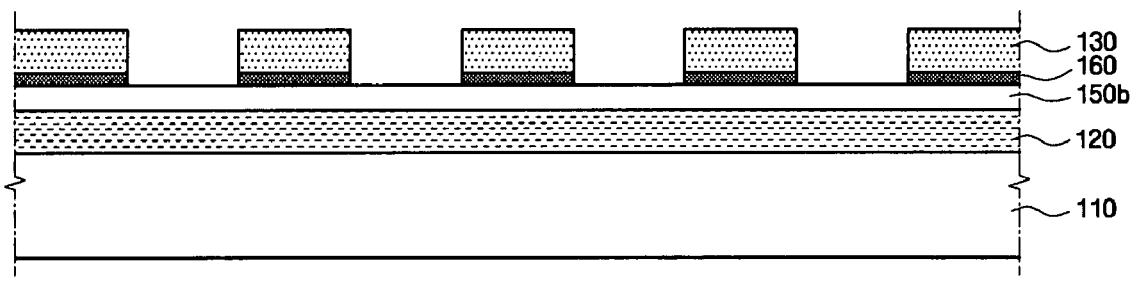
Figure 14C:
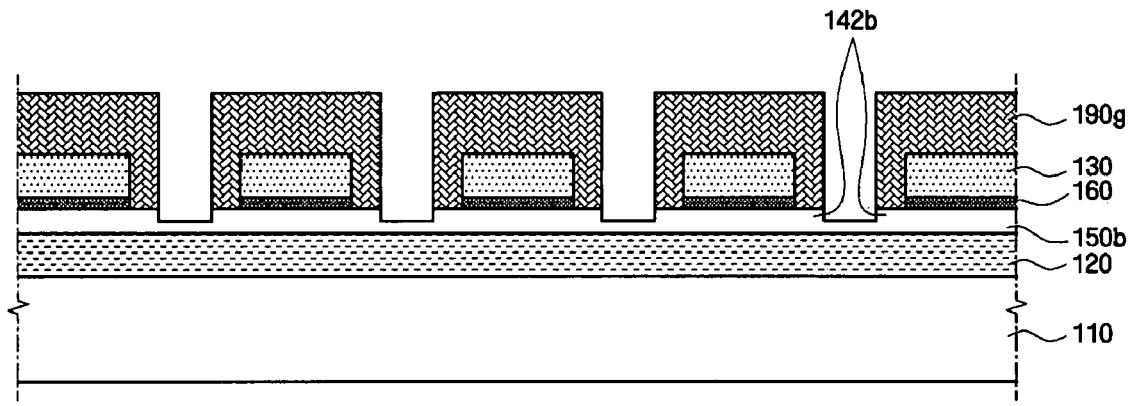

FIGS. 14A to 14C are cross-sectional views illustrating a method of fabricating the reflective photomask illustrated in FIG. 8C according to an example embodiment.

Referring to FIG. 14A, after forming a reflective layer 120 on a substrate 110, forming a capping layer 150b on the reflective layer 120, forming a buffer layer 160a on the capping layer 150b, forming an absorption layer 130a on the buffer layer 160a, and forming a photoresist layer (not shown) on the absorption layer 130a, a first photoresist pattern 190f may be formed by patterning the photoresist layer.

Referring to FIG. 14B, after forming an absorption pattern 130 and a buffer pattern 160 by etching an absorption layer 130a and a buffer layer 160a using a first photoresist pattern 190f as an etching mask, a capping layer 150b may be exposed by removing the first photoresist pattern 190f.

Referring to FIG. 14C, a second photoresist pattern 190g for forming a compensatory portion 142b may be formed. The compensatory portion 142b may be formed by etching the exposed capping layer 150b using the second photoresist pattern 190g as an etching mask. The exposed capping layer 150b may be etched by regulating the etching time.

The thickness of the capping layer 150b may be formed to equal the total thickness of the capping layer 150b and the compensatory portion 142b.

The reflective photomask may then be completed by removing the second photoresist pattern 190g.

Figure 15A:
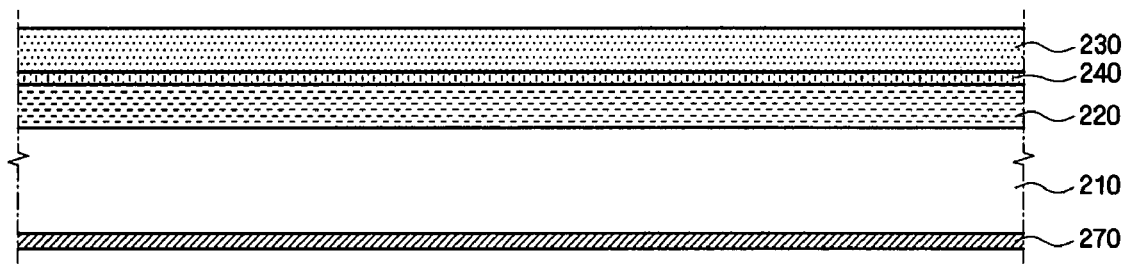
FIGS. 15A to 15C are cross-sectional views illustrating reflective blank photomasks for fabricating a reflective photomask according to example embodiments.
Figure 15B:
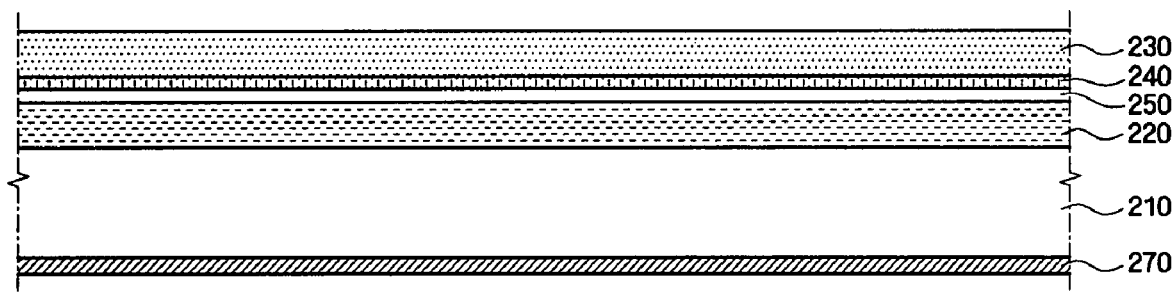
Figure 15C:
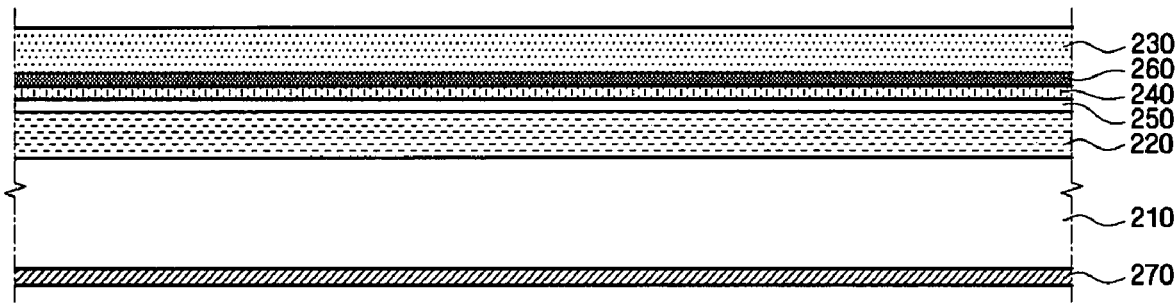

FIGS. 15A to 15C are cross-sectional views illustrating reflective blank photomasks for fabricating a reflective photomask according to example embodiments.

Referring to FIG. 15A, a reflective blank photomask may include a reflective layer 220 formed on a substrate 210, a compensatory layer 240 formed on the reflective layer 220, and an absorption layer 230 formed on the compensatory layer 240.

The substrate 210 may be formed of quartz.

The reflective layer 220 may be formed such that a plurality of materials may be alternately stacked. A first reflective layer and a second reflective layer may be stacked in pairs, and the first reflective layer may be a molybdenum layer and the second reflective layer may be a silicon layer.

The compensatory layer 240 may be formed of at least one of silicon, silicon oxide, molybdenum, or a multilayer thereof, and a metal or a metal compound including ruthenium or chromium.

The absorption layer 230 may be formed of at least one of a metal and a metal compound including chromium, chromium oxide, tantalum, tantalum nitride, or tantalum boron nitride.

The reflective blank photomask may further include a metal layer 270 formed at the lower surface of the substrate 210. The metal layer 270 may be formed of at least one of a metal, metal alloy, metal compound, and other metallic material including, for example, chromium.

A photoresist layer or an electron beam resist layer for patterning may be formed on the absorption layer 230.

Referring to FIG. 15B, a reflective blank photomask may include a reflective layer 220 formed on a substrate 210, a capping layer 250 formed on the reflective layer 220, a compensatory layer 240 formed on the capping layer 250, and an absorption layer 230 formed on the compensatory layer 240.

The reflective blank photomask may further include a metal layer 270 formed at the lower surface of the substrate 210. The metal layer 270 may be formed of at least one of a metal, metal alloy, metal compound, and other metallic material including, for example, chromium.

A photoresist layer or an electron beam resist layer for patterning may be formed on the absorption layer 230.

The capping layer 250 may be formed of at least one of silicon, silicon oxide, molybdenum, or a multilayer thereof, and a metal or a metal compound including ruthenium or chromium.

Referring to FIG. 15C, a reflective blank photomask may include a reflective layer 220 formed on a substrate 210, a capping layer 250 formed on the reflective layer 220, a compensatory layer 240 formed on the capping layer 250, a buffer layer 260 formed on the compensatory layer 240, and an absorption layer 230 formed on the buffer layer 260.

The reflective blank photomask may further include a metal layer 270 formed at the lower surface of the substrate 210. The metal layer 270 may be formed of at least one of a metal, metal alloy, metal compound, and other metallic material including, for example, chromium.

A photoresist layer or an electron beam resist layer for patterning may be formed on the absorption layer 230.

The buffer layer 260 may be formed of at least one of silicon, silicon oxide, molybdenum, or a multilayer thereof, and a metal or a metal compound including ruthenium or chromium.

The reflective blank photomasks according to example embodiments may be used to fabricate the reflective photomasks according to example embodiments.

As described above, the reflective photomasks according to example embodiments may compensate for light reflected in accordance with the height and distance of the absorption pattern to reduce or minimize the shadow effect, to make uniform the line widths of the patterns which may be parallel and vertical to the direction of light to be irradiated, and to make constant the focus of light. As such, the shaking phenomenon of the focus may be improved and patterns may be finely formed.

The foregoing is illustrative of example embodiments and is not to be construed as limiting thereof. Although example embodiments have been described, those skilled in the art will readily appreciate that many modifications are possible in example embodiments without materially departing from the novel teachings and advantages of example embodiments. Accordingly, all such modifications are intended to be included within the scope of the claims. In the claims, means-plus-function clauses are intended to cover the structures described herein as performing the recited function, and not only structural equivalents but also equivalent structures. Therefore, it is to be understood that the foregoing is illustrative of example embodiments and is not to be construed as limited to the specific embodiments disclosed, and that modifications to the disclosed embodiments, as well as other embodiments, are intended to be included within the scope of the appended claims. Example embodiments are defined by the following claims, with equivalents of the claims to be included therein.

What is claimed is:

1. A reflective photomask comprising:
    a substrate;
    a reflective layer over the substrate;
    an absorption pattern over the reflective layer and a first portion of the substrate; and
    a compensatory portion over at least a second portion of the substrate, the second portion adjacent to the first portion, and the compensatory portion being thinner than the absorption pattern.

2. The reflective photomask of claim 1, wherein the compensatory portion is adjacent to at least one side of the absorption pattern.

3. The reflective photomask of claim 1, wherein the compensatory portion includes at least one of silicon, silicon oxide, molybdenum, or a multilayer thereof, and a metal or a metal compound including ruthenium or chromium.

4. The reflective photomask of claim 1, further comprising: a capping layer between the reflective layer and the absorption pattern.

5. The reflective photomask of claim 4, wherein the capping layer includes the compensatory portion.

6. The reflective photomask of claim 5, wherein the compensatory portion is a portion of the capping layer protruding adjacent to a side of the absorption pattern.

7. The reflective photomask of claim 5, further comprising: a buffer pattern between the capping layer and the absorption pattern.

8. The reflective photomask of claim 1, wherein the reflective layer includes the compensatory portion.

9. The reflective photomask of claim 8, further comprising: a protective layer over portions of the reflective layer not covered by the absorption pattern.

10. The reflective photomask of claim 1, further comprising: a buffer pattern between the reflective layer and the absorption pattern.

11. The reflective photomask of claim 10, further comprising: a capping layer between the reflective layer and the buffer pattern.

12. The reflective photomask of claim 1, wherein the compensatory portion is also disposed between the reflective layer and the absorption pattern.

13. The reflective photomask of claim 12, wherein the compensatory portion is wider than the absorption pattern.

14. The reflective photomask of claim 12, further comprising: a protective layer over portions of the reflective layer not covered by the absorption pattern and the compensatory portion.

15. The reflective photomask of claim 14, wherein the protective layer is over portions of the compensatory portion not covered by the absorption pattern.

16. The reflective photomask of claim 12, further comprising: a capping layer between the reflective layer and the compensatory portion.

17. The reflective photomask of claim 16, further comprising: a buffer pattern between the compensatory portion and the absorption pattern.

18. The reflective photomask of claim 1, wherein the reflective layer includes the compensatory portion.

19. The reflective photomask of claim 18, further comprising: a protective layer over portions of the reflective layer not covered by the absorption pattern.

20. The reflective photomask of claim 18, further comprising: a buffer pattern between the reflective layer and the absorption pattern.

21. The reflective photomask of claim 20, further comprising: a protective layer over the reflective layer.

22. A reflective blank photomask comprising:
a substrate;
a reflective layer over the substrate;
a compensatory layer over the reflective layer; and
an absorption layer over the compensatory layer.

23. The reflective blank photomask of claim 22, wherein the compensatory layer is thinner than the absorption layer.

24. The reflective blank photomask of claim 22, further comprising:
a capping layer between the reflective layer and the absorption layer.

25. The reflective blank photomask of claim 24, wherein the capping layer is thinner than the absorption layer.

26. The reflective blank photomask of claim 24, wherein the compensatory layer includes at least one of silicon, silicon oxide, molybdenum, or a multilayer thereof, and a metal or a metal compound including ruthenium or chromium.

27. The reflective blank photomask of claim 22, further comprising:
a buffer layer between the compensatory layer and the absorption layer.

28. The reflective blank photomask of claim 27, wherein the buffer layer is thinner than the absorption layer.

29. The reflective blank photomask of claim 27, wherein the buffer layer includes at least one of silicon, silicon oxide, molybdenum, or a multilayer thereof, and a metal or a metal compound including ruthenium or chromium.

30. A method of fabricating a reflective photomask comprising:
forming a reflective layer over a substrate;
forming an absorption pattern over the reflective layer and a first portion of the substrate; and
forming a compensatory portion over at least a second portion of the substrate, the second portion adjacent to the first portion, and the compensatory portion formed thinner than the absorption pattern.

31. The method of fabricating a reflective photomask of claim 30, wherein the compensatory portion is formed adjacent to at least one side of the absorption pattern.

32. The method of fabricating a reflective photomask of claim 30, wherein the compensatory portion includes at least one of silicon, silicon oxide, molybdenum, or a multilayer thereof, and a metal or a metal compound including ruthenium or chromium.

33. The method of fabricating a reflective photomask of claim 30, further comprising:
forming a capping layer over the reflective layer; and wherein
the absorption pattern is formed over the capping layer.

34. The method of fabricating a reflective photomask of claim 30, wherein the forming the compensatory portion step forms a capping layer over the reflective layer such that the capping layer includes the compensatory portion.

35. The method of fabricating a reflective photomask of claim 34, wherein the compensatory portion is formed as a portion of the capping layer protruding adjacent to a side of the absorption pattern.

36. The method of fabricating a reflective photomask of claim 35, further comprising:
forming a buffer pattern over the capping layer; and wherein
the absorption pattern is formed over the buffer pattern.

37. The method of fabricating a reflective photomask of claim 30, further comprising:
forming a buffer pattern over the reflective layer; and wherein
the absorption pattern is formed over the buffer pattern.

38. The method of fabricating a reflective photomask of claim 37, further comprising:
forming a capping layer over the reflective layer; and wherein
the buffer pattern is formed over the capping layer.

39. The method of fabricating a reflective photomask of claim 30, wherein at least part of the compensatory portion is disposed between the reflective layer and the absorption pattern.

40. The method of fabricating a reflective photomask of claim 39, wherein the compensatory portion is formed wider than the absorption pattern.

41. The method of fabricating a reflective photomask of claim 39, further comprising:
forming a protective layer over portions of the reflective layer not covered by the absorption pattern and the compensatory portion.

42. The method of fabricating a reflective photomask of claim 41, wherein the protective layer is formed over portions of the compensatory portion not covered by the absorption pattern.

43. The method of fabricating a reflective photomask of claim 39, further comprising:
forming a capping layer over the reflective layer; and wherein
the compensatory portion is formed over the capping layer.

44. The method of fabricating a reflective photomask of claim 43, further comprising:
forming a buffer pattern over the compensatory portion; and wherein
the absorption pattern is formed over at least part of the compensatory portion.

45. A method of fabricating a reflective photomask, comprising:
forming a reflective layer over a substrate;
forming an absorption pattern over the reflective layer such that a portion of the reflective layer is exposed and forms a compensatory portion.

46. The method of fabricating a reflective photomask of claim 45, wherein the compensatory portion protrudes adjacent to at least one side of the absorption pattern.

47. The method of fabricating a reflective photomask of claim 45, further comprising:
forming a protective layer over portions of the reflective layer not covered by the absorption pattern.

48. The method of fabricating a reflective photomask of claim 45, further comprising:
forming a buffer pattern over the reflective layer; and wherein
the absorption pattern is formed over the buffer pattern.

49. The method of fabricating a reflective photomask of claim 48, further comprising:
forming a protective layer over the reflective layer.

* * * * *